United States Patent
McCullough et al.

(10) Patent No.: US 6,461,795 B1
(45) Date of Patent: *Oct. 8, 2002

(54) MANUFACTURE OF LITHOGRAPHIC PRINTING FORMS

(75) Inventors: Christopher David McCullough, Fort Collins, CO (US); Kevin Barry Ray, Morley (GB); Alan Stanley Monk, Cheshire (GB); John David Riches, West Yorkshire (GB); Anthony Paul Kitson, West Yorkshire (GB); Gareth Rhodri Parsons, West Yorkshire (GB); David Stephen Riley, West Yorkshire (GB)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/558,109

(22) Filed: Apr. 25, 2000

Related U.S. Application Data

(63) Continuation of application No. PCT/GB98/03191, filed on Oct. 26, 1998.

(30) Foreign Application Priority Data

Oct. 29, 1997 (GB) .............................. 9722861

(51) Int. Cl.⁷ .............................................. G03F 7/039
(52) U.S. Cl. .................... 430/302; 430/270.1; 430/348; 430/944; 430/945; 430/964
(58) Field of Search ................................ 430/165, 188, 430/189, 270.1, 281.1, 283.1, 286.1, 287.1, 288.1, 302, 303, 944, 945, 348, 964

(56) References Cited

U.S. PATENT DOCUMENTS

| | | | |
|---|---|---|---|
| 4,115,120 A | | 9/1978 | Dyer et al. ................... 96/36.2 |
| 4,357,403 A | * | 11/1982 | Shimada et al. ............... 430/18 |
| 4,532,005 A | | 7/1985 | Grieco et al. ............. 156/661.1 |
| 4,708,925 A | | 11/1987 | Newman .................... 430/270 |
| 5,085,972 A | * | 2/1992 | Vogel .......................... 430/270 |
| 5,338,628 A | * | 8/1994 | Kato et al. ..................... 430/95 |
| 5,563,011 A | | 10/1996 | Shipley .......................... 430/7 |
| 5,609,995 A | | 3/1997 | Akram et al. ................ 430/327 |
| 5,691,094 A | * | 11/1997 | Kato ........................... 430/49 |
| 5,786,125 A | * | 7/1998 | Tsuchiya et al. .......... 430/272.1 |
| 6,083,662 A | * | 7/2000 | Miller et al. ................. 430/302 |
| 6,083,664 A | * | 7/2000 | Inno et al. ................... 430/302 |
| 6,110,646 A | * | 8/2000 | Urano et al. ................. 430/302 |
| 6,200,727 B1 | * | 3/2001 | Urano et al. .............. 430/270.1 |
| 6,251,559 B1 | * | 6/2001 | Huang et al. ............. 430/270.1 |
| 6,280,899 B1 | * | 8/2001 | Parsons et al. ........... 430/270.1 |
| 6,296,982 B1 | * | 10/2001 | Yates et al. .................. 430/192 |
| 6,300,038 B1 | * | 10/2001 | Shimazu et al. ......... 430/270.1 |
| 6,352,811 B1 | * | 3/2002 | Patel et al. .............. 430/270.1 |
| 6,358,669 B1 | * | 3/2002 | Savariar Hauck et al. ............ 430/273.1 |

FOREIGN PATENT DOCUMENTS

| | | |
|---|---|---|
| EP | 0001429 | 4/1979 |
| EP | 0672 954 A2 * | 9/1995 |
| EP | 0708372 | 4/1996 |
| EP | 0823327 | 2/1998 |
| EP | 0 894 622 A2 * | 2/1999 |
| EP | 0 897 134 A2 * | 2/1999 |
| GB | 1245924 | 9/1971 |
| WO | 9739894 | 10/1997 |
| WO | WO 99/21715 * | 5/1999 |
| WO | WO 99/21725 * | 5/1999 |

OTHER PUBLICATIONS

DeForest, William S., "Photoresist: materials and processes", McGraw–Hill, Inc., 1975, pp. 230–231.

* cited by examiner

*Primary Examiner*—Janet Baxter
*Assistant Examiner*—Barbara Gilmore
(74) *Attorney, Agent, or Firm*—Baker Botts LLP

(57) ABSTRACT

Phenolic resin compositions formulated for use in lithographic exposure processes are given a heat treatment at 40–90° C. for at least 4 hours shortly after their coating onto lithographic substrates, to produce lithographic printing forms. It is found that such a heat treatment improves later exposure processes, in particular by rendering the sensitivity of the compositions less variable, over time.

71 Claims, No Drawings

MANUFACTURE OF LITHOGRAPHIC PRINTING FORMS

CROSS REFERENCE TO RELATED APPLICATIONS

This application is a continuation of and claims priority from International Application No. PCT/GB98/03191 filed on Oct. 26, 1998 and published in English on May 6, 1999, which in turn claims priority from GB 9722861.3 filed on Oct. 29, 1997.

The present specification relates to methods of manufacturing lithographic printing form precursors. The invention relates further to such lithographic printing form precursors per se, and to their use.

The art of lithographic printing is based on the immiscibility of ink, generally an oily formulation, and water, wherein in the traditional method the ink is preferentially retained by the image or pattern area and the water or fountain solution is preferentially retained by the non-image or non-pattern area. When a suitably prepared surface is moistened with water and an ink is then applied, the background or non-image area retains the water whilst the image area accepts ink and repels the water. The ink on the image area is then transferred to the surface of a material upon which the image is to be reproduced, such as paper, cloth and the like. Commonly the ink is transferred to an intermediate material called the blanket which in turn transfers the ink to the surface of the material upon which the image is to be reproduced.

New types of "waterless" lithographic printing employ only an oily ink material and preferentially ink-accepting image areas and ink-repelling non-image areas on the printing form.

A generally used type of lithographic printing form precursor (by which we mean a coated printing form prior to exposure and development) has a radiation sensitive coating applied to an aluminium substrate. Negative working lithographic printing form precursors have a radiation sensitive coating which when imagewise exposed to radiation of a suitable wavelength hardens in the exposed areas. On development the non-exposed areas of the coated composition are removed leaving the image. On the other hand positive working lithographic printing form precursors have a radiation sensitive coating, which after imagewise exposure to radiation of a suitable wavelength becomes more soluble in the exposed areas than in the non-exposed areas, in a developer. In both cases only the image area on the printing form itself is ink-receptive.

The differentiation between image and non-image areas is made in the exposure process where a film is applied to the printing form precursor with a vacuum to ensure good contact. The printing form precursor is then exposed to a radiation source; conventionally this has been a UV radiation source. In the case where a positive form precursor is used, the area of the film that corresponds to the image in the printing form precursor is opaque so that no light will strike the printing form precursor, whereas the area on the film that corresponds to the non-image area is clear and permits the transmission of light to the coating which becomes more soluble and is removed on development.

Most positive working systems rely on the inhibition of the inherent solubility of phenolic resins, in suitable developers. Traditionally this has been achieved through the use of diazide moieties, especially naphthoquinone diazide (NQD) moieties, to provide compositions which only following exposure to UV radiation are soluble in the developer.

As demands on the performance of UV sensitive positive working coatings have increased so NQD technology has become limiting. In addition, digital and laser imaging technology is making new demands on coatings for lithographic printing.

It is known from GB 1245924 that the solubility of phenolic resins in lithographic developers may be increased by the application of heat. The heat may be delivered by infra-red radiation, assisted by radiation absorbing components such as carbon black or Milori Blue (C.I. Pigment Blue 27). However the developer resistance of the non-exposed areas to commercial developers is low, and the solubility differential is low compared to the commercial UV sensitive compositions containing NQD moieties.

We have devised new positive working heat sensitive systems comprising phenolic resins, to meet the new demands. Our new systems and methods are the subject of our patent applications PCT/GB97/01117, GB 9700877.5 (taken forward as PCT/GB98/00132), GB 9714169.1 (taken forward as PCT/GB98/01953, MY PI 9803095 and ZA 98/5913), GB 9714172.5 (taken forward as PCT/GB98/01957, MY PI 9803069 and ZA 98/5912), and GB 9722862.1, all unpublished at the priority date of this application. We have observed that. in our new systems there may be an alteration in their sensitivity over time, after the heat sensitive composition has been applied to a substrate and dried, such effect being the result of reduced developer solubility of the unexposed compositions with time prior to exposure. Thus when we mention "sensitivity" in this specification we are considering this in the context of the entire process of exposure and development. We are not referring to the matter of how the areas of the composition which are exposed react to that exposure. Sometimes this "sensitivity" is called "operating speed" in the art.

We have devised a process which improves the new systems mentioned above, such that a consistent and stable material can be supplied to an end user. The invention may also be applied to other compositions containing phenolic resins, for example those of GB 1245924 mentioned above, as well as those of U.S. Pat. Nos. 5,491,046, 5,466,557, 5,372,915, 5,372,907 and U.S. Pat. No. 4,708,925, described hereinafter.

In accordance with a first aspect of the invention there is provided a method of manufacturing a printing form precursor which comprises a coating on a substrate, the coating comprising a positive working composition which comprises a phenolic resin, wherein the method of manufacturing comprises the application of the composition in a solvent to the substrate, the drying of the composition, and the subsequent heat treatment of the coated substrate.

Preferably the composition of the precursor manufactured by the method of the invention is heat sensitive, such that its solubility in a developer increases in heated areas during patternwise exposure. Suitably it may be patternwise exposed by direct heat, or by charged particle radiation or electromagnetic radiation, in each case converted to heat by the coating. In the latter case the electromagnetic radiation to which the coating is sensitive is preferably of wavelength exceeding 450 nm (i.e. entirely or predominantly above 450 nm), preferably exceeding 500 nm, more preferably exceeding 600 nm. In patternwise exposing the precursor the use of electromagnetic radiation is preferred.

A said preferred, heat sensitive, composition preferably includes a modifying means for modifying the properties of the composition. Such a modifying means is preferably arranged to alter the developer solubility of the composition compared to when said modifying means is not present in a said composition. Said modifying means may be covalently bonded to said phenolic resin or may be a compound which is not covalently bonded to said phenolic resin.

Said modifying means may be selected from:

functional groups Q, as described in any statement hereinafter with regard to what is referred to as the "'169 invention";

diazide moieties;

nitrogen containing compounds wherein at least one nitrogen atom is either quaternized, incorporated in a heterocyclic ring or quaternized and incorporated in a heterocyclic ring, as described in any statement hereinafter with regard to what is referred to as the "'117 invention";

latent Bronsted acids, onium salts or acid generating compounds as described in any statement hereinafter with regard to further compositions.

Said heat sensitive composition preferably passes tests 1 to 5 described hereinafter with respect to the '117 invention wherein a reference in the tests to an "active polymer" should be substituted with a reference to said phenolic resin, described above in the absence of said modifying means; and a reference to a "reversible insolubiliser compound" should be substituted with a reference to said modifying means.

As indicated above the invention can be applied to compositions containing diazide moieties. We have discovered that compositions containing diazide moieties may be patternwise exposed other than by UV radiation, for example by direct heat or by charged particle radiation or by electromagnetic radiation exceeding 500 nm. This invention is referred to hereinafter as "the '172 invention". Infra-red radiation is preferred for the exposure process for such compositions and such compositions preferably contain a suitable infra-red radiation absorber. The invention may be applied with benefit to any such compositions but may also be applied to compositions containing diazide moieties, and intended or adapted for traditional UV exposure methods.

However, the preferred embodiments of the present invention involve the heat treatment of compositions which do not contain diazide moieties.

The composition is preferably such that its solubility in a developer is not increased by incident UV radiation; thus also passing test 6 described later with reference to the '117 invention.

It is found that by carrying out a suitable heat treatment the sensitivity of the composition may be rendered less variable, over time. Furthermore, we have found that some compositions can only be exposed in a practicable manner if they have been given a heat treatment in accordance with the present invention, during the manufacture of the respective precursors.

In general terms it may be stated that to achieve good results the heat treatment should employ an elevated temperature, for an extended period; but the range of effective conditions, and the optimal conditions to achieve a substantially constant sensitivity over time, and at a practicable level, will vary from case to case, and can readily be determined by trial and error. We believe that a suitable heat treatment accelerates the formation of a stable network structure within the composition. If the elevated temperature is too low we believe the time required for this stable network structure to form is too long to be practicable. Furthermore in relation to the minimum suitable temperature it should be borne in mind that the elevated temperature should desirably not be less than that which the precursor might typically be subjected to in transit or in storage, or otherwise changes in sensitivity may occur. Consequently we favour carrying out the heat treatment at a temperature of at least 40° C., preferably at least 45° C., most preferably at least 50° C. As regards the upper limit, we believe that at too high a temperature the time for which the heat treatment should be carried out in order to obtain a desired level and stability of sensitivity is likely to be overly critical, and that even when the sensitivity is adequately stable, it is likely to be too low to be of use. Again, trial and error can easily be used to make this determination but as a guide we favour using a temperature not in excess of 90° C., preferably not in excess of 85° C., most preferably not in excess of 60° C.

We believe that temperatures in the range 50–60° C. (inclusive) may be most favoured in the method of the present invention.

The time for the heat treatment can also be determined by trial and error. Generally, the lower the temperature for the heat treatment, the longer the time should be. In all cases however we favour carrying out the heat treatment for at least 4 hours; and preferably for at least 24 hours and most preferably for at least 48 hours, especially in the case of the lower temperatures.

The time and temperature conditions for the heat treatment may be contrasted with the time and temperature conditions for the drying step. The heat treatment step preferably employs a lower temperature and a longer time, than the drying step. In the drying step the aim is to "flash dry" the composition. The time may typically be 15–600 seconds, especially 25–250 seconds and the temperature may typically be at least 70° C., suitably 80–150° C., especially 90–140° C. The drying step should be carried out until the coating is self-supporting and dry to the touch. However it is not necessary (and may not even be possible) to remove all the solvent, in the drying step (or in the later heat treatment step). Indeed the residual solvent content may be regarded as an additional composition variable by means of which the composition may be optimised, as we have found that higher amounts of solvent may be beneficial in the later patternwise exposure and development process; compositions with higher amounts of retained solvent appear to be more sensitive than corresponding compositions with lower amounts of retained solvent.

The time and temperature conditions for the heat treatment of the invention, carried out by the manufacturing of the precursor, may also be contrasted with the delivery of heat during the later exposure processes, for those preferred compositions which are heat sensitive, the latter delivery of heat being of very short duration and very high intensity.

The solvent itself is not critical; any solvent in which the composition can be dissolved and which may be removed by evaporation after coating may be used.

It will be appreciated that a primary object of the invention is to render the sensitivity (as previously defined) of the composition less variable over time. This is suitably assessed over a period of time which is the longest interval likely, between the manufacture of the printing form precursor and the use of the printing form precursor, by a customer. We regard one year as being a suitable period of time, for this assessment. In absolute terms, preferably the heat treatment is such that the sensitivity reduction in a given practical developer, for example 14 wt % sodium metasilicate pentahydrate in water, of said composition over a one year period after the heat treatment does not exceed 15%; and preferably does not exceed 10%.

A further object of the present invention is that the sensitivity of the preferred compositions should be at a practicable level, after the heat treatment; but suitably no more than 400 mJcm$^{-2}$, preferably no more than 250 mJcm$^{-2}$, most preferably no more than 200 mJcm$^{-2}$.

Novolak resins are useful in this invention, suitably being condensation reaction products between appropriate phenols, for example phenol itself, C-alkyl substituted phenols (including cresols, xylenols, p-tert-butyl-phenol, p-phenylphenol and nonyl phenols), diphenols e.g. bisphenol-A (2,2-bis(4-hydroxyphenyl)propane), and appropriate aldehydes, for example formaldehyde, chloral, acetaldehyde and furfuraldehyde. The type of catalyst and the molar ratio of the reactants used in the preparation of phenolic resins determines their molecular structure and therefore the physical properties of the resin. An aldehyde:phenol ratio between 0.5:1 and 1:1, preferably 0.5:1 to 0.8:1 and an acid catalyst is used to prepare those phenolic resins generally known as novolaks which are thermoplastic in character. Higher aldehyde:phenol ratios of more then 1:1 to 3:1, and a basic catalyst would give rise to a class of phenolic resins known as resoles, and these are characterised by their ability to be thermally hardened at elevated temperatures.

Particularly useful phenolic resins in this invention are the condensation products from the interaction between phenol, C-alkyl substituted phenols (such as cresols and p-tert-butyl-phenol), diphenols (such as bisphenol-A) and aldehydes (such as formaldehyde). Dependent on the preparation route for the condensation a range of phenolic materials with varying structures and properties can be formed. Particularly useful in this invention are novolak resins, resole resins and novolak/resole resin mixtures. Most preferred are novolak resins. Examples of suitable novolak resins have the following general structure

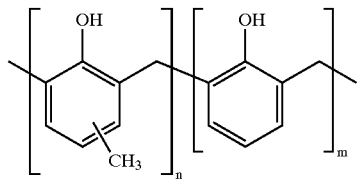

where n = m

Preferably the composition contains at least 20%, more preferably at least 50%, most preferably at least 70% of a phenolic resin, or of phenolic resins in total, by weight on total weight of the composition. Other polymers suitable for inclusion in the composition, in admixture with a phenolic resin, include: poly-4-hydroxystyrene; copolymers of 4-hydroxystyrene, for example with 3-methyl-4-hydroxystyrene or 4-methoxystyrene; copolymers of (meth)acrylic acid, for example with styrene; copolymers of maleiimide, for example with styrene; hydroxy or carboxy functionalised celluloses; dialkylmaleiimide esters; copolymers of maleic anhydride, for example with styrene; and partially hydrolysed polymers of maleic anhydride.

The composition is preferably such that it is patternwise solubilized by heat, during the pattern forming (exposure) process. In broad terms there are three ways in which heat can be patternwise delivered to the composition, in use. These are:

direct heat, by which we mean the direct delivery of heat by a heated body, by conduction. For example the composition may be contacted by a heat stylus; or the reverse face of the substrate onto which the composition has been coated may be contacted by a heated body. A heated body may be a heat stylus.

the use of incident electromagnetic radiation to expose the composition, the electromagnetic radiation being converted to heat, either directly or by a chemical reaction undergone by a component of the composition. The electromagnetic radiation could for example be infra-red, or UV or visible radiation, depending on the composition. Preferably it is infra-red.

the use of charged-particle radiation, for example electron beam radiation. Clearly, at the fundamental level the charged-particle mode and the electromagnetic mode are convergent; but the distinction is clear at the practical level.

In order to increase the sensitivity of the preferred heat sensitive compositions used in the present invention it is beneficial in embodiments intended for exposure using electromagnetic radiation to include an additional component, namely a radiation absorbing compound capable of absorbing the incident electromagnetic radiation and converting it to heat (hereinafter called a "radiation absorbing compound"). It may also be desirable to include a suitable radiation absorbing compound in embodiments intended for exposure using charged particle radiation.

In preferred compositions intended to require electromagnetic radiation for exposure, the composition may be such that it can be exposed directly by means of a laser. Preferably, such a laser emits radiation at above 450 nm, preferably above 500 nm, more preferably above 600 nm, and especially above 700 nm. Most preferably it emits radiation at above 800 nm. Suitably it emits radiation of wavelength below 1400 nm, preferably below 1200 nm. In such compositions a suitable radiation absorbing compound, to convert the radiation to heat, may usefully be a black body radiation absorber, such as carbon black or graphite. It may be a commercially available pigment such as Heliogen Green as supplied by BASF or Nigrosine Base NG1 as supplied by NH Laboratories Inc or Milori Blue (C.I. Pigment Blue 27) as supplied by Aldrich.

Examples of lasers which can be used to expose compositions suitable for the method of the present invention include semiconductor diode lasers emitting at between 450 nm and 1400 nm, especially between 600 nm and 1100 nm. An example is the Nd YAG laser which emits at 1064 nm, but any laser of sufficient imaging power and whose radiation is absorbed by the composition, can be used.

Preferably the radiation absorbing compound is one whose absorption spectrum is such that absorption is significant at the wavelength output of the radiation source, preferably laser, which is to be used in the patternwise exposure of precursors made by the method of the present invention. Usefully it may be an organic pigment or dye such as phthalocyanine pigment. Alternatively it may be a dye or pigment of the squarylium, merocyanine, cyanine, indolizine, pyrylium or metal dithioline classes.

In preferred compositions intended to require infra-red radiation for patternwise exposure it is preferred that their developer solubility is not increased by incident UV or visible radiation, so making handling of the compositions straightforward. Preferably such compositions do not comprise any UV or visible light sensitive components. However UV or visible light sensitive components which are not activated by UV or visible light due to the presence of other components, such as UV or visible light absorbing dyes or a UV or visible light absorbing topmost layer, may be present in such compositions.

Pigments are generally insoluble in the compositions and so comprise particles therein. Generally they are broad band absorbers, preferably able efficiently to absorb electromagnetic radiation and convert it to heat over a range of wavelengths exceeding 200 nm, preferably exceeding 400 nm. Generally they are not decomposed by the radiation. Generally they have no or insignificant effect on the solubility of the unheated composition, in the developer. In contrast dyes are generally soluble in the compositions. Generally they are narrow band absorbers, typically able efficiently to absorb electromagnetic radiation and convert it to heat only over a range of wavelengths typically not exceeding 100 nm, and so have to be selected having regard to the wavelength of the radiation which is to be used for imaging. Many dyes have a marked effect on the solubility of the unheated composition in the developer, typically making it much less soluble, and use of such dyes is not within the ambit of the present invention.

Suitably the radiation absorbing compound, when present, constitutes at least 0.25%, preferably at least 0–5%, more preferably at least 1%, most preferably at least 2%, preferably up to 25%, more preferably up to 20%, most preferably up to 15%, of the total weight of the composition. A preferred weight range for the radiation absorbing compound may be expressed as 2–15% of the total weight of the composition. More specifically, in the case of dyes the range may preferably be 0.25–15% of the total weight of the composition, preferably 0.5–8%, whilst in the case of pigments the range may preferably be 1–25%, preferably 2–15%. For pigments, 5–15% may be especially suitable. In each case the figures given are as a percentage of the total weight of the dried composition. There may be more than one radiation absorbing compound. References herein to the proportion of such compound(s) are to their total content.

The compositions used in the invention may contain other ingredients such as stabilising additives, inert colorants, and additional inert polymeric binders as are present in many positive working compositions.

In certain embodiments of the invention an additional layer comprising a radiation absorbing compound can be used. This multiple layer construction can provide routes to high sensitivity as larger quantities of absorber can be used without affecting the function of the image forming layer. In principle any radiation absorbing material which absorbs sufficiently strongly in the desired band can be incorporated or fabricated in a uniform coating. Dyes, metals and pigments (including metal oxides) may be used in the form of vapour deposited layers. Techniques for the formation and use of such films are well known in the art, for example as described in EP 0,652,483.

Said printing form precursor includes a substrate over which said heat sensitive composition is provided. Said substrate may be arranged to be non-ink-accepting. Said substrate may have a hydrophilic surface for use in conventional lithographic printing using a fount solution or it may have a release surface suitable for use in waterless printing.

Said substrate may comprise a metal layer. Preferred metals include aluminium, zinc and titanium, with aluminium being especially preferred. Said substrate may comprise an alloy of the aforesaid metals. Other alloys that may be used include brass and steel, for example stainless steel.

Said substrate may comprise a non-metal layer. Preferred non-metal layers include layers of plastics, paper or the like. Preferred plastics include polyester, especially polyethylene terephthalate.

Said substrate may be any type of substrate usable in printing. For example, it may comprise a cylinder or, preferably, a plate.

The substrate may be an aluminium plate which has undergone the usual anodic, graining and post-anodic treatments well known in the lithographic art for enabling a radiation sensitive composition to be coated thereon and for the surface of the support to function as a printing background. Another substrate which may be used in the present invention in the context of lithography is a plastics material base or a treated paper base as used in the photographic industry. A particularly useful plastics material base is polyethylene terephthlate which has been subbed to render its surface hydrophilic. Also a so-called coated paper which has been corona discharge treated can be used.

In the specification when we state that a composition is developer soluble we mean that it is soluble in a selected developer, to an extent useful in a lithographic printing form development process. When we state that a composition is developer insoluble we mean that it is not soluble in the. selected developer, to an extent useful in a lithographic printing form development process.

Thus in preferred embodiments a positive working lithographic printing form may be obtained after patternwise exposure and development of a precursor made by the method of the present invention. The developer solubility of the composition after it has been subjected to heat during patternwise exposure is greater than the solubility of the corresponding unexposed composition. In preferred embodiments this solubility differential is increased by means of additional components and/or by resin modification, as described herein. Preferably such measures reduce the solubility of the resin, prior to the patternwise exposure. On subsequent patternwise exposure the exposed areas of the composition are rendered more soluble in the developer, than the unexposed areas. Therefore on patternwise exposure there is a change in the solubility differential of the unexposed composition and of the exposed composition. Thus in the exposed areas the composition is dissolved, to form the pattern.

The coated printing form precursor produced by the method of the invention may in use be patternwise heated indirectly by exposure to a short duration of high intensity radiation transmitted or reflected from the background areas of a graphic original located in contact with the recording material.

The developer is dependent on the nature of the polymeric substance, but is preferably an aqueous developer. Common components of aqueous developers are surfactants, chelating agents such as salts of ethylenediamine tetraacetic acid, organic solvents such as benzyl alcohol, and alkaline components such as inorganic metasilicates, organic metasilicates, hydroxides or bicarbonates.

Preferably an aqueous developer is an alkaline developer containing inorganic or organic metasilicates.

As indicated above preferred compositions to which the method of the present invention may advantageously be applied contain infra-red absorbing compounds. Examples of suitable infra-red absorbing compounds are:

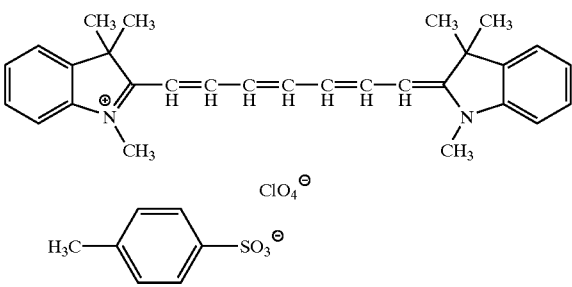

-continued

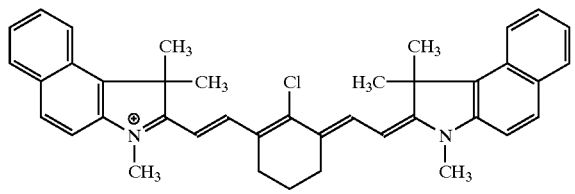

and KF654B PINA as supplied by Riedel de Haen UK, Middlesex, England, believed to have the structure:

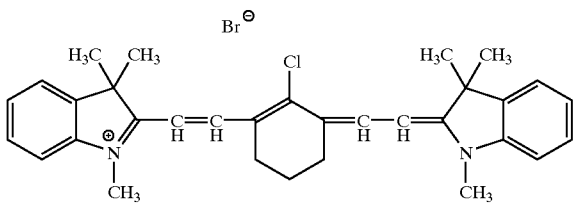

We believe the present invention can be applied with benefit to any precursor whose composition comprises a phenolic resin; but especially to such compositions arranged such that patternwise exposure entails the delivery of heat to selected areas of the precursor.

Thus the present invention is applicable to the heat sensitive phenolic resin systems described in GB 1245924, incorporated herein by reference, these being simple systems comprising a phenolic resin and a radiation absorber, preferably a black body absorber, for example carbon black or Milori Blue, without further components to enhance the solubility differential of the composition, on patternwise exposure.

The present invention is also applicable to the systems described in U.S. Pat. No. 5,491,046, incorporated herein by reference, whose heat sensitive compositions comprise latent Bronsted acids. These are negative working and positive working; the latter being of interest in the context of the present invention.

In the systems of U.S. Pat. No. 5,491,046 it is said that the said heat sensitive compositions may comprise a resole resin, a novolak resin, a latent Bronsted acid and an infra-red absorber, said compositions being arranged to be sensitive to both ultraviolet and infra-red radiation.

Optionally terephthaldehyde may be included as a speed enhancing agent.

Optionally 3,4,5-trimethoxybenzoic acid may be included, to enhance image/non-image contrast.

Said resole resin may be prepared from bis-phenol A and formaldehyde. Said novolak resin may be prepared from m-cresol and formaldehyde.

The term "latent Bronsted acid" refers to a precursor which forms a Bronsted acid by decomposition. Typical examples of Bronsted acids which are suitable for this purpose are trifluoromethane sulphonic acid and hexafluorophosphoric acid.

Ionic latent Bronsted acids are also suitable. Examples of these include onium salts, in particular iodonium, sulfonium, phosphonium, selenonium, diazonium and arsonium salts. Specific examples of particularly useful onium salts include: diphenyliodonium hexafluorophosphate, triphenylsulfonium hexafluoroantimonate, phenylmethyl-ortho-cyanobenzylsulfonium trifluoromethane sulfonate, and 2-methoxy-4-aminophenyl diazonium hexafluorophosphate.

Non-ionic latent Bronsted acids are also suitable. Examples of these include compounds of the formula:

$R^3CH_2X$ $R^3CHX_2$ $R^3CX_3$ $R^3(CH_2X)_2$ and $R^3(CH_2X)_3$ wherein X is Cl, Br, F, or $CF_2SO_3$ and $R^3$ is an aromatic group, an aliphatic group or a combination of aromatic and aliphatic groups.

Useful ionic latent Bronsted acids include those represented by the formula:

$Y^+R^4R^5R^6R^7W^{31}$

When Y is iodine then $R^6$ and $R^7$ are electron lone pairs and $R^4$ and $R^5$ are aryl or substituted aryl groups. When Y is S or Se then $R^7$ is an electron lone pair and $R^4$, $R^5$ and $R^6$ can be an aryl group, a substituted aryl group, an aliphatic group or a substituted aliphatic group. when Y is P or As, then $R^7$ can be an aryl group, a substituted aryl group, an aliphatic group or a substituted aliphatic group. W can be $BF_4$, $CF_3SO_3$, $SbF_6$, $CCl_3CO_2$, $ClO_4$, $AsF_6$, $PF_6$, or any corresponding acid whose pH is less than three.

Any of the onium salts described in U.S. Pat. No. 4,708,925, incorporated herein by reference, can be utilized as the latent Bronsted acid.

Use of diazonium salts as latent Bronsted acids is particularly preferred. They provide equivalent sensitivity to other latent Bronsted acids in the infra-red region and higher sensitivity in the ultraviolet region.

An additional class of useful latent Bronsted acids are the haloalkyl-substituted s-triazines. The haloalkyl-substituted s-triazines are well known photolytic acid generators. Use of these compounds for this purpose is described, for example, in U.S. Pat. No 3,779,778, incorporated herein by reference.

Preferred haloalkyl-substituted s-triazines for use in this invention are compounds of the formula:

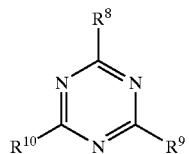

wherein $R^8$ is a substituted or unsubstituted aliphatic or aromatic radical and $R^9$ and $R^{10}$ are, independently, haloalkyl groups.

In the above formula, it is especially preferred that $R^9$ and $R^{10}$ are haloalkyl groups of 1 to 4 carbon atoms.

$R^8$ can include any substituent which does not adversely affect the photolytic acid-generating capability of the s-triazine compound. Such substituents include alkyl groups and alkoxy groups.

Particularly preferred haloalkyl-substituted s-triazines are compounds of the formula:

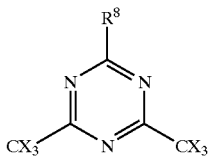

wherein $R_8$ is a substituted or unsubstituted aliphatic or aromatic radical and each X preferably is, independently, a halogen atom.

The most preferred haloalkyl-substituted s-triazines compounds for use in these embodiments are of the formula:

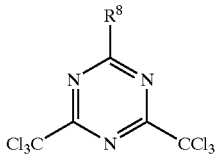

wherein $R^8$ is an aryl group of 6 to 15 carbon atoms, such as, for example, phenyl or naphthyl.

The infra-red absorber may be as previously described.

The present invention is also applicable to the similar systems described in U.S. Pat. Nos. 5,466,557, 5,372,915 and 5,372,907, related to U.S. Pat. No. 5,491,046 and likewise incorporated herein by reference.

We also believe the present invention to be applicable to the phenolic resin systems described in U.S. Pat. No. 4,708,925, comprising an onium salt. Suitable onium salts include iodonium, sulphonium, bromonium, chloronium, oxysulphonium, sulphoxonium, selenonium, telluronium, phosphonium and arsonium salts. Preferably, an iodonium, sulphonium or oxysulphonium salt is present.

The onium salt is generally included in the composition in an amount in the range from 1 to 40% by weight of the total weight of phenolic resin and onium salt. The amount of onium salt is selected to provide the desired solubility differential between the unexposed and exposed compositions. It has been found that resole resins normally require the onium salt in an amount of at least 5% by weight of the total weight of phenolic resin and onium salt in order to ensure a satisfactory solubility differential. Generally, compositions employing resole resins will include at least 7% by weight, of onium salt. It is possible to achieve a satisfactory solubility differential in compositions containing novolak resins containing smaller amounts of onium salt, generally in the range 1 to 40% by weight of onium salt. Suitably a further component of such compositions is a spectral sensitiser in an amount of up to 10% by weight of the composition, selected from one of the following classes: diphenylmethane, xanthene, acridine, methine and polymethine, (including oxonol, cyanine and merocyanine) dye, thiazole, thiazine, azine, aminoketone, porphyrin, coloured aromatic polycyclic hydrocarbon, p-substituted aminostyryl compound, aminotriazyl methane, polyarylene, polyarylpolyene, 2,5-diphenylisobenzofuran, 2,5-diarylcyclopentadiene, diarylfuran, diarylthiofuran, diarylpyrrole, polyarylphenylene, coumarin and polyaryl-2-pyrazoline. Further information on these compositions is given in U.S. Pat No. 4,708,925 and the disclosure thereof is incorporated herein by reference.

We will now describe separately, in detail, five of our new systems which are the subject of patent applications to which the method of the present invention may be applied.

The method of the present invention as described above may be applied to our novel compositions as described in our patent application PCT/GB97/01117 which we herebelow call the '117 invention. This patent application was unpublished at the priority date of the present invention and has since been published under the publication number WO 97/39894. The pages which follow are incorporated from the PCT specification. These passages use the terms "aqueous developer soluble polymeric substance" and "active polymer" and in the context of the present invention involving stabilisation by heat treatment these terms denote phenolic resins.

According to one aspect of the '117 invention there is provided an ink-accepting heat-sensitive composition comprising an aqueous developer soluble polymeric substance, hereinafter called the "active polymer", and a compound which reduces the aqueous developer solubility of the polymeric substance, hereinafter called the "reversible insolubiliser compound", characterised in that the aqueous developer solubility of the composition is increased on heating and that the aqueous developer solubility of the composition is not increased by incident UV radiation.

According to a further aspect of the '117 invention there is provided a positive working lithographic printing form precursor having a coating comprising of a composition comprising a said active polymer and a said reversible insolubiliser compound coated on a support having a hydrophilic surface characterised in that the aqueous developer solubility of the composition is increased on heating and that the aqueous developer solubility of the composition is not increased by incident UV radiation.

In order to increase the sensitivity of the heat-sensitive composition of the '117 invention it is beneficial to include an additional component, namely a radiation absorbing compound capable of absorbing radiation and converting it to heat. Examples of suitable radiation absorbing compounds, together with the preferred amounts thereof, are given above.

Therefore a further aspect of the '117 invention is a lithographic printing form precursor wherein said coating is suitable adapted to preferentially absorb radiation and convert said radiation to heat.

Therefore according to a preferred embodiment of the '117 invention there is provided a heat-sensitive positive working lithographic printing form precursor which has on a support having a hydrophilic surface an ink-accepting heat-sensitive composition comprising a said active polymer, a said reversible insolubiliser compound and a said radiation absorbing compound, characterised in that the aqueous developer solubility of the composition is increased on heating and that the aqueous developer solubility of the composition is not increased by incident UV radiation.

In a further preferred embodiment of the '117 invention there is provided a heat-sensitive positive working lithographic printing form precursor wherein the said coating includes an additional layer disposed beneath the ink-accepting, heat-sensitive composition, wherein the additional layer comprises a radiation absorbing compound.

In a further preferred embodiment of the '117 invention there is provided a heat-sensitive positive working lithographic printing form precursor which has on a support having a hydrophilic surface an ink-accepting, heat-sensitive composition comprising a said active polymer and a said reversible insolubiliser compound which is also a said radiation absorbing compound characterised in that the aqueous developer solubility of the composition is not increased on heating and that the aqueous developer solubility of the composition is not increased by incident UV radiation.

In describing the '117 compositions, when we state that the aqueous developer solubility of the composition is increased on heating we mean that it is substantially increased, i.e. by an amount useful in a lithographic printing process. When we state that the aqueous developer solubility of the composition is not increased by incident UV radiation we mean that it is not substantially increased, that is by an amount which would mean that UV safelighting conditions would have to be employed. Thus, insubstantial increases in solubility on UV radiation may be tolerated within the scope of the '117 invention.

Thus in all preferred embodiments of the '117 invention a positive working lithographic printing form is obtained after heat-mode exposure and development. The aqueous developer solubility of the coated composition is much reduced with respect to the solubility of the active polymer alone. On subsequent exposure to suitable radiation the heated areas of the composition are rendered more soluble in the developing solution, than the untreated areas. Therefore on patternwise exposure there is a change in the solubility differential of the unexposed composition and of the exposed composition. Thus in the exposed areas the composition is dissolved revealing the underlying surface of the printing form.

Whilst the applicants do not wish to be limited by any theoretical explanation of how the '117 invention operates, it is believed that a thermally frangible complex is formed between the active polymer and the reversible insolubiliser compound. This complex is believed to be reversibly formed and can be broken by application of heat to the complex to restore aqueous developer solubility to the composition. It is thought that polymeric substances suitable for use in the current invention comprise electron rich functional groups when uncomplexed and that suitable compounds which reduce the aqueous developer solubility of the polymeric substance are electron poor. It is not thought that decomposition of components within the composition is required, or that any substantial decomposition has occurred in any examples tested to date.

A large number of compounds which reduce the aqueous solubility of suitable polymeric substances have been located for use as reversible insolubiliser compounds.

A useful class of reversible insolubiliser compounds are nitrogen containing compounds wherein at least one nitrogen atom is either quarternized, incorporated in a heterocyclic ring or quarternized and incorporated in a heterocyclic ring.

Examples of useful quarternized nitrogen containing compounds are triaryl methane dyes such as Crystal Violet (CI basic violet 3) and Ethyl Violet and tetraalkyl ammonium compounds such as Cetrimide.

More preferably the reversible insolubiliser compound is a nitrogen-containing heterocyclic compound.

Examples of suitable nitrogen-containing heterocyclic compounds are quinoline and triazols, such as 1,2,4-triazol.

Most preferably the reversible insolubiliser compound is a quarternized heterocyclic compound.

Examples of suitable quarternized heterocyclic compounds are imidazoline compounds, such as Monazoline C, Monazoline O, Monazoline CY and Monazoline T all of which are manufactured by Mona Industries, quinolinium compounds, such 1-ethyl-2-methyl quinolinium iodide and 1-ethyl-4-methyl quinolinium iodide, and benzothiazolium compounds, such as 3-ethyl-2-methyl benzothiazolium iodide, and pyridinium compounds, such as cetyl pyridinium bromide, ethyl viologen dibromide and fluoropyridinium tetrafluoroborate.

Usefully the quinolinium or benzothiazolium compounds are cationic cyanine dyes, such as Quinoldine Blue and 3-ethyl-2-[3-(3-ethyl-2(3H)-benzothiazolylidene)-2-methyl-1-propenyl] benzothiazolium iodide, and the compound of formula

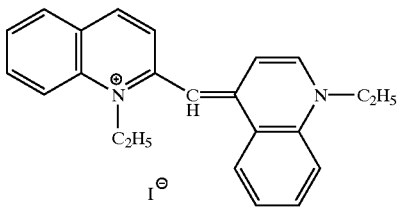

A further useful class of reversible insolubiliser compounds are carbonyl functional group containing compounds.

Examples of suitable carbonyl containing compounds are α-naphthoflavone, β-naphthoflavone, 2,3-diphenyl-1-indeneone, flavone, flavanone, xanthone, benzophenone, N-(4-bromobutyl)phthalimide and phenanthrenequinone.

The reversible insolubiliser compound may be a compound of general formula $Q_1$—S(O)$_a$—$Q_2$ where $Q_1$ represents an optionally substituted phenyl or alkyl group, a represents 0, 1 or 2, and $Q_2$ represents a halogen atom or any alkoxy group. Preferably $Q_1$ represents a $C_{1-4}$ alkyl- phenyl group, for example a tolyl group, or a $C_{1-4}$ alkyl group. Preferably a represents 1 or, especially, 2. Preferably $Q_2$ represents a chlorine atom or a $C_{1-4}$ alkoxy group, especially an ethoxy group.

Another useful reversible insolubiliser compound is acridine orange base (CI solvent orange 15).

Other useful reversible insolubiliser compounds are ferrocenium compounds, such as ferrocenium hexafluorophosphate.

In addition to the active polymer which interacts with the reversible insolubiliser compound in the first embodiment, the composition may contain a polymeric substance which does not thus interact and which is not a developer resistor means as described herein. In such a composition having a blend of polymeric substances it should be noted that the active polymer can be present in a lower amount, by weight, than the additional polymeric substance(s). Suitably the active polymer is present in an amount of at least 10%, preferably at least 25%, more preferably at least 50%, by total weight of the polymer substances present in the composition. Most preferably, however, the active polymer is present to the exclusion of any said additional polymeric substance(s) which do not interact.

The major proportion of the composition is preferably constituted by polymeric substance(s), including the active polymer and, when present, an additional polymeric substance which does not thus interact. Preferably a minor proportion of the composition is constituted by the reversible insolubiliser compound.

A major proportion as defined herein is suitably at least 50%, preferably at least 65%, most preferably at least 80%, of the total weight of the composition.

A minor proportion as defined herein is suitably less than 50%, preferably up to 20%, most preferably up to 15%, of the total weight of the composition.

Suitably the reversible insolubiliser compound constitutes at least 1%, preferably at least 2%, preferably up to 15%, more preferably up to 25% of the total weight of the composition.

Thus a preferred weight range for the reversible insolubiliser compound may be expressed as 2–15% of the total weight of the composition.

There may be more than one active polymer which interacts with the said reversible insolubiliser compound. References herein to the proportion of such substance(s) are to their total content. Likewise there may be more than one polymeric substance which does not thus interact. References herein to the proportion of such substance(s) are to their total content. Likewise there may be more then one reversible insolubiliser compound. References herein to the proportion of such compound(s) are to their total content.

Six simple tests, tests 1 to 6, may be carried out to determine if a composition comprising an active polymer and a reversible insolubiliser compound and a suitable aqueous developer are suitable for use as described in the '117 invention.

Test 1. The composition comprising the active polymer in the absence of the reversible insolubiliser compound is coated on a hydrophilic support and dried. Then the surface is inked-up. If a uniform inked coating is obtained then the composition is oleophilic when laid down as a layer.

Test 2. A hydrophilic support coated with the composition comprising the active polymer in the absence of the reversible insolubiliser compound is processed in a suitable aqueous developer for a suitable time which may be determined by trial and error but will typically be between 30 to 60 seconds, at room temperature, and then rinsed, dried and inked-up. If no ink surface is obtained then the composition has dissolved in the developer.

Test 3. The composition comprising the active polymer and the reversible insolubiliser compound is coated on a hydrophilic support, dried and inked-up. If a uniform inked coating is obtained then the composition is oleophilic when laid down as a layer.

Test 4. A hydrophilic support coated with the composition comprising the active polymer and the reversible insolubiliser compound is processed in a suitable aqueous developer for a suitable time which may be determined by trial and error but will typically be between 30 and 60 seconds, at room temperature, and then rinsed, dried and inked-up. If a uniform inked coating is obtained then the composition does not substantially dissolve in the developing solution.

Test 5. A hydrophilic support coated with the composition comprising the active polymer and the reversible insolubiliser compound is heated in an oven such that the composition reaches a suitable temperature for an appropriate time. Then it is processed in a suitable aqueous developer for a reasonable period of time at room temperature.

The surface is then dried and inked-up. If no ink surface is obtained then the heated composition has dissolved in the developer.

The temperature and time depend on the components selected for the composition and on their proportion. Simple trial and error experiments may be undertaken to determine suitable conditions. If such experiments cannot yield conditions which allow the test to be passed, the conclusion must be that the composition does not pass this test.

Preferably, for typical compositions, the composition comprising the active polymer and the reversible insolubiliser compound is heated in an oven such that the composition reaches a temperature of 50° C. to 160° C. for 5 to 20 seconds. Then it is processed in a suitable aqueous developer for a suitable time which may be determined by trial and error but will typically be 30 to 120 seconds, at room temperature.

Most preferably, the composition comprising the active polymer and the reversible insolubiliser compound is heated in an oven such that the composition reaches a temperature of 50° C. to 120° C. for 10 to 15 seconds. Then it is processed in a suitable aqueous developer for 30 to 90 seconds at room temperature.

Test 6. A hydrophilic support coated with the composition comprising the active polymer and the reversible insolubiliser compound is exposed to U.V. light for a suitable time which may be determined by trial and error but will typically be 30 seconds. Then it is processed in a suitable aqueous developer for a suitable time which may be determined by trial and error but will typically be 30 to 60 seconds at room temperature. The surface is then dried and inked-up. If the coating is inked-up no UV radiation induced solubilisation of the composition has occurred and thus the composition is suitably robust to normal working lighting conditions.

If the composition can pass all six tests then it is suitable for use in a composition according to the '117 invention.

Compounds which reduce the aqueous developer solubility of the polymeric substance and are also radiation absorbing compounds suitable for embodiments of the '117 invention are preferably cyanine dyes and most preferably quinolinium cyanine dyes which absorb at above 600 nm.

Examples of such compounds are:

2-[3-chloro-5-(1-ethyl-2(1H)-quinolinylidene)-1,3-pentadienyl]-1-ethylquinolinium bromide

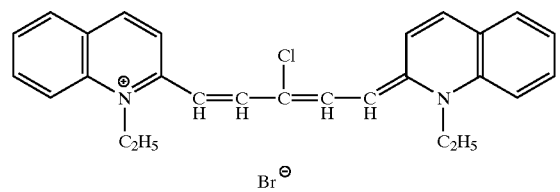

1-ethyl-2-[5-(1-ethyl-2(1H)-quinolinylidene)-1,3-pentadienyl]quinolinium iodide

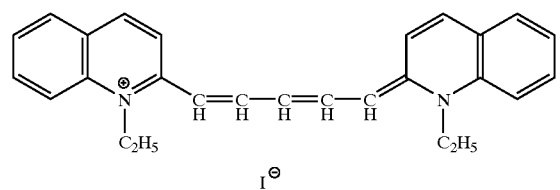

4-[3-chloro-5-(1-ethyl-4(1H)-quinolinylidene)-1,3-pentadienyl]-1-ethylquinolinium iodide

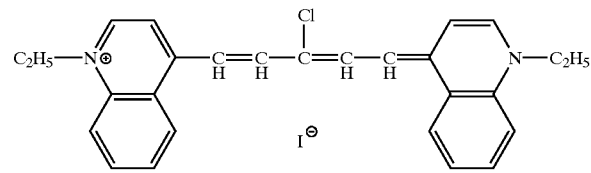

1-ethyl-4-[5-(1-ethyl-4(1H)-quinolinylidene)-1,3-pentadienyl]quinolinium iodide

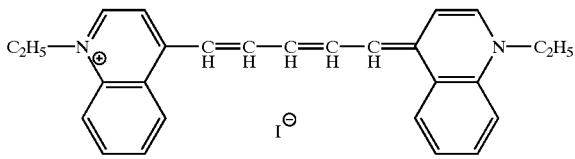

That concludes the general description of our earlier '117 invention, to which the present invention can be applied.

The method of the present invention as defined above may be applied to our novel compositions as described in our unpublished U.K. patent application No. 9714169.1 (hereinafter called the '169 invention), now taken forward as PCT/GB98/01953, MY PI 9803095 and ZA 98/5913. The pages which follow are incorporated from these specifications. These passages use the term "polymeric substance" and in the context of the present invention this term denotes a phenolic resin.

In accordance with a first aspect of the '169 invention there is provided a method for producing a predetermined resist pattern on a substrate, the method comprising: the patternwise application of radiation to a precursor which comprises the substrate, having a coating thereon, the coating comprising a positive working composition; and the development of the pattern using a developer; wherein the said composition comprises a polymeric substance having functional groups Q thereon, such that the functionalised polymeric substance has the property that it is developer insoluble prior to delivery of radiation and developer soluble thereafter, characterised in that the functional groups Q do not comprise a naphthoquinone diazide (NQD) or a benzoquinone diazide (BQD) group.

In accordance with a second aspect of the '169 invention there is provided a method for producing a predetermined resist pattern on a substrate, the method comprising: the patternwise application of radiation to a precursor which comprises the substrate, having a coating thereon, the coating comprising a positive working composition; and the development of the pattern using a developer; wherein the said composition comprises a polymeric substance having functional groups Q thereon, such that the functionalised polymeric substance has the property that it is developer insoluble prior to delivery of radiation and developer soluble thereafter, characterised in that the functional groups Q do not contain a diazide group.

In accordance with a third aspect of the '169 invention there is provided a method for producing a predetermined resist pattern on a substrate, the method comprising: the patternwise application of radiation to a precursor which comprises the substrate, having a coating thereon, the coating comprising a positive working composition; and the development of the pattern using a developer; wherein the said composition comprises a polymeric substance having functional groups Q thereon, such that the functionalised polymeric substance has the property that it is developer insoluble prior to delivery of radiation and developer soluble thereafter, characterised in that the functional groups are not chemically decomposed on exposure to said radiation. By "not chemically decomposed" we mean that covalent bonds are not broken by exposure to said radiation to any extent which is significant in the effectiveness of the method.

In accordance with a fourth aspect of the '169 invention there is provided a method for producing a predetermined resist pattern on a substrate, the method comprising: the patternwise application of radiation to a precursor which comprises the substrate, having a coating thereon, the coating comprising a positive working composition; and the development of the pattern using a developer; wherein the said composition comprises a polymeric substance having functional groups Q thereon, such that the functionalised polymeric substance has the property that it is developer insoluble prior to delivery of radiation and developer soluble thereafter, characterised in that the functional groups Q do not comprise acid groups or acid generating groups, in each case protected by labile protective groups removed on exposure to said radiation.

In accordance with a fifth aspect of the '169 invention there is provided a method for producing a predetermined resist pattern on a substrate, the method comprising: the patternwise application of radiation to a precursor which comprises the substrate, having a coating thereon, the coating comprising a positive working composition; and the development of the pattern using a developer; wherein the said composition comprises a polymeric substance having functional groups Q thereon, such that the functionalised polymeric substance has the property that it is developer insoluble prior to delivery of radiation and developer soluble thereafter, characterised in that the functional groups Q are not additionally primarily responsible for the absorption of said radiation.

In relation to the '169 invention it is believed that the difference in the solubility between the functionalised polymeric substance compared with the corresponding unfunctionalised polymeric substance may involve several mechanisms but that acid generation on exposure to said radiation is not significant, in contrast to existing systems. It is further believed that one important mechanism is a hydrogen bonding interaction between the functional groups Q and other groups of the polymeric substance. Intramolecular hydrogen bonding is likely to be more important but intermolecular hydrogen bonding may also be important, and may even be more important in some systems. Suitably, therefore, the functionalised polymeric substance is such that there is hydrogen bonding between the said functional groups Q and other groups of the polymeric substance, in addition to covalent bonding of the functional groups Q, to the polymeric substance.

In accordance with a sixth aspect of the '169 invention there is provided a method for producing a predetermined resist pattern on a substrate, the method comprising: the patternwise application of radiation to a precursor which comprises the substrate, having a coating thereon, the coating comprising a positive working composition; and the development of the pattern using a developer; wherein the said composition comprises a polymeric substance having functional groups Q thereon, such that the functionalised polymeric substance has the property that it is developer insoluble prior to delivery of radiation and developer soluble thereafter, characterised in that there is hydrogen bonding between said functional groups Q and other groups of the same molecule or other molecule(s) of the polymeric substance.

In order to increase the sensitivity of the heat-sensitive composition of the '169 invention it is beneficial to include an additional component, namely a radiation absorbing compound capable of absorbing radiation and converting it to heat. Examples of suitable radiation absorbing compositions, together with the preferred amounts thereof, are given above.

In the practice of the '169 invention it is preferred that composition components are selected, which do not produce a gas upon exposure to radiation.

Preferably the corresponding unfunctionalised polymeric substance is significantly more soluble in a selected developer, than the corresponding polymeric substance functionalised by the groups Q. Preferably, in practical terms it may be regarded as a soluble polymeric substance.

It is believed that heat breaks down the hydrogen bonding with no primary structure decomposition i.e. no covalent bond breaking is believed to be required for the effectiveness of the method.

Although the '169 invention is not limited in respect of the manner in which the groups Q are bonded to the polymeric substance, preferably a said corresponding unfunctionalised polymeric substance has hydroxy groups, which are functionalised by the groups Q. Preferably the said functionalised polymeric substance retains hydroxy groups. That is, the functional groups Q may covalently bond to the polymeric substance through reaction with hydroxy groups thereof, but preferably not all of the hydroxy groups are thereby reacted.

Preferably the ratio of functional groups Q in the functionalised polymeric substance to hydroxy groups in the corresponding unfunctionalised polymeric substance is in the range 1:100 to 1:2. More preferably the said functional group ratio is in the range 1:50 to 1:3. Most preferably the said functional group ratio is in the range 1:20 to 1:6.

The functional groups Q suitably enable hydrogen bonding with moieties of the functionalised polymer. Suitable moieties Q known to favour hydrogen bonding and which may be comprised by the functional groups Q, may include amino, monoalkylamino, dialkylamino, amido, monoalkylamido, dialkylamido, chloro, fluoro, carbonyl, sulphinyl and sulphonyl moieties.

Preferably the functional groups Q are bonded to the polymeric substance by an esterification reaction to form a resin ester.

A preferred composition of the '169 invention may be defined by the formula $R(Q)_n$ where R is the polymer chain of the polymeric substance and $(Q)_n$ represents functional groups bonded thereto, and Q represents a moiety which can hydrogen bond to the polymer chain R of the same molecule or an adjacent molecule or molecules. n represents a plural integer.

Preferably Q represents a group of formula —T—Z where T represents a moiety which can hydrogen bond to the polymer chain R of the same molecule or an adjacent molecule or molecules and Z represents a further moiety which may or may not hydrogen bond to the polymer chain R. In such cases the polymer chain R requires other substituents which can participate in the hydrogen bonding, for example hydroxy groups.

Suitably Q represents a group of formula —O—$T^1$—Z where $T^1$ is a moiety which can hydrogen bond to the polymer chain R of the same molecule or an adjacent molecule or molecules. Suitably $T^1$ represents a carbonyl group, a sulphinyl group or a sulphonyl group. Preferably it represents a carbonyl or, especially, a sulphonyl group.

One group Q may be covalently bonded to the phenolic resin at more than one site thereof, to form a cyclic structure. For example Q may be defined as being a group of formula —O—X(Z)—O— where X represents a linking moiety and Z represents a said further moiety. This may occur, for example, in certain phosphorus-modified novolak resins, produced by reaction with phosphoric acids or phosphorus oxyhalides.

Preferably a said linking moiety X can hydrogen bond to the polymer chain R of the same molecule or an adjacent molecule or molecules.

In such embodiments, a said linking moiety X may suitably be a group of formula —P(O)—.

A moiety Z may for example be an optionally substituted alkyl, alkenyl, alkynyl, cycloalkyl, aryl, heteroaryl, non-aromatic heterocyclic, aralkyl or heteroaralkyl group.

Unless otherwise indicated the following definitions apply in relation to the '169 invention:

an alkyl, alkenyl or alkynyl group may be linear or branched and may contain up to 10, preferably up to 8, carbon atoms, suitable examples being methyl, ethyl, propyl, butyl, pentyl, hexyl, heptyl, octyl, vinyl, allyl and propargyl. Unbranched groups may be preferred but branched groups may be employed.

a cycloalkyl group may contain from 3 to 12, preferably 3 to 8, carbon atoms, and is suitably cyclopropyl or cyclohexyl, but could be a fused/bridged structure such as 10-camphoryl.

the alkylene portion of an aralkyl or heteroaralkyl group is suitably a $C_{1-4}$ alkylene group, especially methylene (—$CH_2$—).

aryl groups are preferably naphthyl or phenyl.

aralkyl groups are preferably ($C_{1-4}$ alkyl)phenyl or ($C_{1-4}$ alkyl) naphthyl, especially benzyl or naphthylmethyl.

heteroaromatic or heterocyclic groups suitably are respectively aromatic or non-aromatic groups, containing within the carbon atom ring or rings 1 to 4 hetero atoms independently selected from oxygen, sulphur and nitrogen. Fused heteroaromatic or heterocyclic groups may be employed but preferably the group is a single ring having 5 or 6 atoms in the ring. Preferred is pyrazolyl and, especially, thienyl.

in relation to optional substituents of the aliphatic moieties set out above, namely alkyl, cycloalkyl, alkenyl, alkynyl and heterocyclic (non-aromatic) groups and of the alkylene portions of the aralkyl and heteroaralkyl groups, specific examples of such substituents include halo, nitro, cyano, carbonyl, hydroxy, thiol, amino, mono-$C_{1-4}$ alkylamino, di-$C_{1-4}$ alkylamino, amido (—$CONH_2$), mono-($C_{1-4}$ alkyl)amido (—$CONHR^1$), di-($C_{1-4}$alkyl)amido (—$CONR^1R^2$), $C_{1-4}$ alkoxy, $C_{1-4}$ haloalkoxy, ($C_{1-4}$alkyl)carbonylamino ($R^3C(O)NH$—, for example acetamido), —COOH, ($C_{1-4}$ alkyl) carbonyl and ($C_{1-4}$ alkoxy)carbonyl groups. Good results have however, been obtained using aliphatic moieties which are unsubstituted.

in relation to optional substituents of an aryl or heteroaryl moiety set out above, including of an aralkyl or heteroaralkyl group, optional substituents include halo, nitro, cyano, hydroxy, thiol, amino mono-$C_{1-4}$ alkylamino, di-$C_{1-4}$ alkylamino, amido (—$CONH_2$), mono-($C_{1-4}$ alkyl)amido (—$CONHR^1$), di-($C_{1-4}$ alkyl) amido ($CONR^1R^2$), $C_{2-4}$ alkenyl, $C_{1-4}$ alkyl, $C_{1-4}$ alkoxy, ($C_{1-4}$ alkyl)carbonylamino ($R^3C(O)NH$—, for example acetamido), —COOH, ($C_{1-4}$ alkyl)carbonyl and ($C_{1-4}$ alkoxy) carbonyl. When there is substitution of said aryl or heteroaryl groups 1 to 3 substituents may suitably be employed. Alkyl, alkylamino, alkylamido, alkylcarbonylamino, alkenyl, alkoxy, alkylcarbonyl and alkoxycarbonyl moieties carried by said aryl or heteroaryl groups are preferably unsubstituted but may be substituted by substituents selected from the list given above for aliphatic moieties.

a halo moiety is preferably a fluoro, chloro or bromo group. Preferably the moiety Z is an optionally substituted aryl, heteroaryl or alkyl group. An especially preferred aryl group is a phenyl or naphthyl group optionally substituted by 1–3 moieties independently selected from hydroxy, halo, $C_{1-4}$ alkyl (especially methyl), $C_{1-4}$ haloalkyl (especially $CF_3$), $C_{1-4}$ alkoxy (especially methoxy), amino, mono-($C_{1-4}$ alkyl)amino (especially methylamino), and di-($C_{1-4}$ alkyl)amino (especially dimethylamino). An especially preferred aryl group is a naphthyl group, a dansyl group, a phenyl group or a 4-methylphenyl group. An especially preferred optionally substituted alkyl group is a $C_{2-8}$ alkyl group, especially an n-$C_{3-6}$ alkyl group.

An especially preferred composition of the invention comprises a phenolic resin, to hydroxy groups of which moieties selected from —O—$SO_2$-tolyl, —O-dansyl, —O—$SO_2$-thienyl, or —O—$SO_2$-naphthyl and —O—CO—Ph are bonded.

It should be noted that the '169 invention is characterised in certain aspects by the presence, in the composition, of functional groups Q which do not contain an NQD or BQD group. However the presence of diazide groups additional to the functional groups Q is not excluded from the above definitions of the invention.

Also, the presence, in the composition, of simple diazide compounds, for example NQD or BQD compounds, is not excluded from the above definitions of the '169 invention.

Thus, one composition useful in the method of the '169 invention comprises a phenolic resin having groups Q (preferably hydroxy groups to which moieties selected from —O—$SO_2$-tolyl, —O-dansyl, —O—$SO_2$-thienyl, —O—$SO_2$-naphthyl and —O—CO—Ph are bonded) in admixture with simple diazide-containing compounds.

Another composition useful in the method of the '169 invention comprises a phenolic resin, to hydroxy groups of which sulphonyl diazide moieties are bonded, and to further hydroxy groups of which moieties Q, preferably selected from —O—$SO_2$-tolyl, —O-dansyl, —O—$SO_2$-thienyl, —O—$SO_2$-naphthyl and —O—CO—Ph, are bonded.

Compositions containing resins carrying groups Q and also containing diazide groups may be novel and constitute a further aspect of the '169 invention. Furthermore resins bearing diazide groups and groups Q as separate functional groups, examples being described in the previous paragraph, are novel and constitute a further aspect of the '169 invention, along with methods for their preparation, suitably by co-esterification.

When diazide groups are used in the '169 invention they preferably comprise diazo groups $=N_2$ conjugated to carbonyl groups, preferably via an aromatic or heteroaromatic ring. In such moieties a carbonyl group is preferably bonded to the aromatic or heteroaromatic ring at an adjacent ring position to the diazo group. Preferred moieties are o-benzoquinonediazide (BQD) moieties (often referred to as o-quinonediazides) and o-napthoquinonediazide (NQD) moieties.

A BQD moiety may, for example, comprise the 1,4- or, preferably, the 1,2-benzoquinonediazide moiety.

An NQD moiety may, for example, comprise the 1,4-, 2,1- or, most preferably, the 1,2-naphthoquinone diazide Generally, NQD moieties are preferred to BQD moieties when used in the practice of the '169 invention.

The most preferred diazide moiety when used in the practice of the '169 invention is the 1,2-naphthoquinonediazide moiety.

In addition to the polymeric substance, or substances, defined above, the composition may contain an additional polymeric substance, or substances, preferably unfunctionalised phenolic resins. Such may be regarded as "inactive", in having a given level of inherent developer solubility and not being functionalised to alter that inherent developer solubility, or may be regarded as an additional "active" polymeric substance, or substances, including for example an NQD resin ester. In such a composition having a blend of polymeric substances it should be noted that the functionalised polymeric substance(s) of the '169 invention can be present in a lower amount, by weight, than the other polymeric substance(s). Suitably the polymeric substance of the '169 invention may be present in an amount of at least 10%, preferably at least 20% by total weight of the polymeric substances present in the composition.

It should be noted that the quantitative definitions presented above are typical ranges, and that the precise selection will depend on the particular circumstances. .For example the selection of highly effective functional groups Q may mean that a blend of polymeric substances may be used, with the functionalised polymeric substance(s) of the '169 invention in relatively low proportion; and/or that the aforesaid functional group ratio may be lower than if a less effective functional group had been selected. The pattern-forming conditions selected and the developer to be used, will also be of relevance. The selection of a higher functional group ratio may mean that a lesser amount of polymeric substance(s) of the '169 invention in a blend thereof may be employed ; an inherently more soluble unfunctionalised polymeric substance may mean that a weaker developer can be used (to environmental advantage), or a lesser delivery of radiation, or a lower functional group ratio, or a faster processing speed either in terms of radiation delivery or development time, or both. There are thus several composition, imaging and developing variables which can be employed to advantage for a given application.

The major proportion of the composition of the '169 invention is preferably constituted by polymeric substance (s), including the "active" polymeric substance(s) and, when present, "inactive" polymeric substance(s). Preferably a minor proportion of the composition is constituted by additional components, when present at all.

A major proportion as defined herein is suitably at least 50%, preferably at least 65%, most preferably at least 80%, of the total weight of the composition.

A minor proportion as defined herein is suitably less than 50%, preferably up to 20%, most preferably up to 15%, of the total weight of the composition.

In accordance with a further aspect of the '169 invention a functionalised polymeric substance is a resin ester of the general formula $R(Q)_n$ where R is the polymer chain of the polymeric substance, and Q represents a group of formula —O—$T^1$—Z where $T^1$ represents a carbonyl group, a sulphinyl group or a sulphonyl group, or a group of the formula —O—X(Z)—O— where X represents a group —P(O)—; wherein Z represents an alkyl, alkenyl, alkynyl, cycloalkyl, aryl, heteroaryl, non-aromatic heterocyclic, aralkyl or heteroaralkyl group, each such group being optionally substituted; wherein optional substituents of the aryl and heteroaryl groups, and of the aryl and heteroaryl parts of the aralkyl or heteroaralkyl groups, are selected from halo, nitro, cyano, hydroxy, thiol, amino, optionally substituted mono-$C_{1-4}$ alkylamino, optionally substituted di-$C_{1-4}$ alkylamino, amido, optionally substituted mono-($C_{1-4}$ alkyl)amido, optionally substituted di-($C_{1-4}$ alkyl)amido, optionally substituted $C_{2-4}$ alkenyl, optionally substituted $C_{1-4}$ alkyl, optionally substituted $C_{1-4}$ alkoxy, ($C_{1-4}$ alkyl)carbonylamino, —COOH, optionally substituted ($C_{1-4}$ alkyl)carbonyl and optionally substituted ($C_{1-4}$ alkoxy) carbonyl groups; and wherein optional substituents of the alkyl, alkenyl, alkynyl, cycloalkyl and non-aromatic heterocyclic groups, and of the alkyl parts of the aralkyl and heteroaralkyl groups, and of the alkyl, alkoxy, alkylamino, alkylamido, alkylcarbonyl, alkoxycarbonyl, alkylcarbonylamino and alkenyl moieties optionally substituting said aryl or heteroaryl moieties are selected from halo, nitro, cyano, carbonyl, hydroxy, thiol, amino, mono-$C_{1-4}$ alkylamino, di-$C_{1-4}$ alkylamino, amido, mono-($C_{1-4}$ alkyl)amido, di-($C_{1-4}$alkyl) amido, $C_{1-4}$ alkoxy, —COOH, ($C_{1-4}$ alkyl) carbonylamino, ($C_{1-4}$ alkyl)carbonyl and ($C_{1-4}$ alkoxyl) carbonyl groups.

Simple tests may be carried out to determine if the phenolic resin composition is likely to be suitable for use in the '169 invention. Such tests may be substantially as described above in relation to the '117 invention, except that they are applied to the "unfunctionalised polymeric substance" and "functionalised polymeric substance" of the '169 invention, rather than the "active polymer" and "active polymer and reversible insolubiliser compound" of the '117 invention; and except that Test 6 described above in relation to the '117 invention is not relevant unless the '169 composition is formulated so as to be insensitive to UV radiation.

That concludes the general description of our earlier '169 invention, to which the present invention can be applied.

The method of the present invention may be applied to compositions described in our unpublished U.K. patent application No. 9714172.5 (hereinafter called the '172 invention), now taken forward as PCT/GB98/01957, MY PI 9803069 and ZA 98/5912. The pages which follow are incorporated from these specifications. These passages use the term "polymeric substance" and in the context of the present invention this term denotes a phenolic resin.

In accordance with the '172 invention there is provided a method for producing a predetermined resist pattern on a substrate, the method comprising: the patternwise application of radiation to a precursor which comprises the substrate, having a coating thereon, the coating comprising a positive working composition; and the application to. the coating of a developer; wherein the said composition comprises a polymeric substance and diazide moieties, wherein the said composition has the property that it is developer insoluble prior to delivery of said radiation and developer soluble thereafter, wherein said radiation is entirely or predominantly direct heat radiation or electromagnetic radiation of wavelength exceeding 500 nm.

Preferably the polymeric substance in the absence of said diazide moieties is significantly more soluble in a selected developer, than the corresponding polymeric substance in the presence of said diazide moieties. Preferably, in practical terms it may be regarded as a soluble polymeric substance.

In order to increase the sensitivity of the heat-sensitive composition of the '172 invention it is beneficial to include an additional component, namely a radiation absorbing compound capable of absorbing radiation and converting it to heat. Examples of suitable radiation absorbing compositions, together with the preferred amounts thereof, are given above.

Diazide moieties used in the '172 invention preferably comprise diazo groups =$N_2$ conjugated to carbonyl groups, preferably via an aromatic or heteroaromatic ring. In such moieties a carbonyl group is preferably bonded to the aromatic or heteroaromatic ring at an adjacent ring position to the diazo group. Preferred moieties are o-benzoquinonediazide (BQD) moieties (often referred to as o-quinonediazides) and o-napthoquinonediazide (NQD) moieties.

A BQD moiety may, for example, comprise the 1,4- or, preferably 1,2-benzoquinonediazide moiety.

An NQD moiety may, for example, comprise the 1,4-, 2,1- or, most preferably, the 1,2-naphthoquinone diazide moiety.

Generally, NQD moieties are preferred to BQD moieties in the practice of the '172 invention.

Most preferred in the practice of the '172 invention is the 1,2-naphthoquinonediazide moiety.

Suitably the composition comprises a BQD or NQD ester of a phenolic polymeric substance or a BQD or NQD compound, for example, ester and a phenolic polymeric substance in admixture. The preferred esters are sulphonate esters.

Examples of preferred naphthoquinone diazide moieties which may be used in the photosensitive composition are disclosed in a variety of publications such as U.S. Pat. Nos. 2,766,118; 2,767,092; 2,772,972; 2,859,112; 2,907,665; 3,046,110; 3,046,111; 3,046,115; 3,046,118; 3,046,119; 3,046,120; 3,046,121; 3,046,122; 3,036,123; 3,061,430; 3,102,809; 3,105,465; 3,635,709; and 3,647,443. Among these, preferred are o-naphthoquinonediazido sulphonates or o-naphthoquinonediazido carboxylates of aromatic hydroxyl compounds; o-naphthoquinone diazido sulphonic acid amides or o-naphthoquinonediazido carboxylic acid amides of aromatic amine compounds, for instance, esters of naphthoquinone-1,2-diazido sulphonic acid with polyhydroxyphenyl; esters of naphthoquinone-1,2-diazido-4-sulphonic acid or naphthoquinone-1,2-diazido-5-sulphonic acid with pyrogallol/acetone resins; esters of naphthoquinone-1,2-diazidosulphonic acid with novolak-type phenol/formaldehyde resins or novolak-type cresol/formaldehyde resins; amides of poly(p-aminostyrene) and naphthoquinone-1,2-diazido-4-sulphonic acid or naphthoquinone-1,2-diazido-5-sulphonic acid; esters of poly (p-hydroxystyrene) and naphthoquinone-1,2-diazido-4-sulphonic acid or naphthoquinone-1,2-diazido-5-sulphonic acid; and amides of polymeric amines with naphthoquinone-1,2-diazido-4-sulphonic acid. The term "ester" used herein also includes partial esters.

The '172 invention requires the use of a composition comprising a polymeric substance and diazide moieties. The diazide moieties may be present as simple compounds admixed with the polymeric substance or, as is preferred, as moieties covalently bonded to the polymeric substance. It should be noted that moieties not comprising diazide moieties, may additionally be covalently bonded to the polymeric substance; or may advantageously be functional groups of an additional polymeric substance, within the composition. Such moieties are suitably moieties Q of the '169 invention, as previously described; the earlier definitions thereof apply here.

The method of the '172 invention as set out above is a positive working method but it has also been determined that by means of a further step a negative working method is possible. This requires an overall exposure to UV radiation subsequent to the said patternwise application of radiation, and prior to the said application to the coating of the developer. It is then found that the areas of the coating not exposed to the patternwise radiation dissolve. This constitutes a further aspect of the '172 invention. The heat treatment method of the present invention may advantageously be applied to precursors intended for this mode of exposure.

Simple tests may be carried out to determine if the composition comprising the polymeric substance, the selected developer and hydrophilic support, are together likely to be suitable for the positive working method of the '172 invention. The tests are as described earlier with reference to the '117 invention except that they are applied to the "polymeric substance" and "polymeric substance and diazide moieties" of the '172 invention rather than the "active polymer" and "reversible insolubiliser compound" of the '117 invention; and except that Test 6 thereof is not likely to be required.

That concludes the general description of our '172 invention, to which the present invention can be applied.

The method of the present invention as defined above may be applied to the positive working aspects of our novel compositions as described in our unpublished patent application GB 9700877.5 (hereinafter "the '877 invention"), now taken forward as PCT/GB98/00132. The pages which follow are incorporated from these specifications.

In the '877 invention a heat-sensitive composition may comprise a novolak resin, a condensing agent for the novolak resin, a radiation sensitive latent acid generating compound and an infra-red absorbing compound.

Examples of infra-red absorbing compounds, together with preferred amounts thereof, are given above.

Said condensing agent may be an optionally-substituted polyvinyl phenol compound or a bis-hydroxyalkyl compound.

A preferred polyvinyl phenol compound is a copolymer comprising the following units.

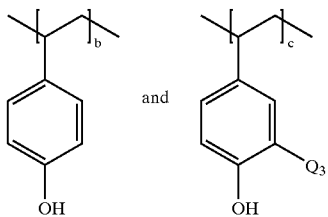

wherein $Q_3$ represents a hydroxyalkyl group, especially —$CH_2OH$, and b and c independently represent integers.

A preferred bis-hydroxyalkyl compound is a bis-hydroxymethyl compound, with 2,6-bis(hydroxymethyl)-p-cresol being especially preferred.

Said latent acid generating compound may be a latent Bronsted acid for example as described above in relation to the other compositions to which the invention can be applied.

Preferred latent acid generating compounds are:

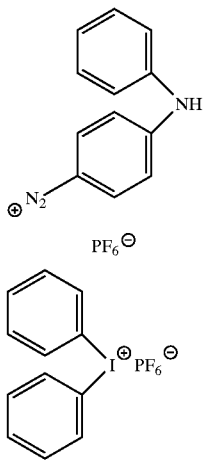

-continued

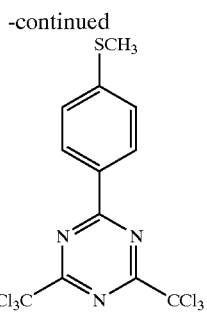

That concludes the general description of our earlier '877 invention, to which the present invention can be applied.

The methods of the present invention as defined above may be applied to our novel compositions as described in our unpublished patent application GB 9722862.1 (hereinafter "the '862 invention"). The pages which follow are incorporated from that specification. The term "heat sensitive composition" as used in the description which follows denotes the composition comprising the phenolic resin, of the present invention.

The '862 invention provides a precursor for preparing a resist pattern by heat mode imaging, the precursor comprising a heat sensitive composition, the solubility of which in an aqueous developer is arranged to increase in heated areas, and a means for increasing the resistance of non-heated areas of the heat sensitive composition to dissolution in an aqueous developer (hereinafter the "developer resistance means"), wherein said developer resistance means comprises one or more compounds selected from the groups comprising:

(A) compounds which include a poly(alkylene oxide) unit;

(B) siloxanes; and (C) esters, ethers and amides of polyhydric alcohols.

Developer resistance means of the type described have been found, surprisingly, to provide a relatively large increase in the resistance of non-heated areas to developer compared to the resistance when no developer resistance means is present. For example, there may be at least a 50% increase in the time taken for a first heat sensitive composition containing a said developer resistance means to completely dissolve in a developer (e.g. a typical commercially available positive lithographic plate developer) compared to the time taken for complete dissolution of a heat sensitive composition which does not contain said developer resistance means but is in all other respects identical to said first heat sensitive composition. In some embodiments, the increase may be greater than 65% or even greater than 80%.

Said developer resistance means is preferably non-ionic. It is preferably a surfactant.

Unless otherwise stated in relation to the developer resistance means, an alkyl group may have up to 12, suitably up to 10, preferably up to 8, more preferably up to 6, especially up to 4 carbon atoms.

Unless otherwise stated in relation to the developer resistance means, where any group is stated to be "optionally-substituted", it may be substituted by one or more: halogen atoms, especially fluorine, chlorine or bromine. atoms; hydroxy or cyano groups; carboxyl groups or carboxy derivatives, for example carboxylic acid salts; and optionally-substituted alkyl, alkenyl, alkynyl, alkoxy, amino, sulphinyl, sulphonyl, sulphonate and carbonyl groups.

Compounds in group (A) may include a unit of formula

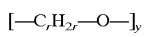   I wherein r is an integer in the range 2 to 5 and y is an integer in the range 2 to 5,000. The moiety —$C_rH_{2r}$— may include straight or branched chains.

Preferably, r represents 2 or 3. Where r represents 3, said unit of formula I may represent a 1- or, preferably, a 2-oxypropylene unit.

Suitably, y is less than 500, is preferably less than 350, is more preferably less than 200 and, especially, is less than 100.

Examples of compounds in group (A) include the following, wherein R represents a hydrogen atom or an optionally-substituted, preferably an unsubstituted, alkyl or phenyl group; l represents 0 to 3, preferably 1; z is suitably less than 500, is preferably less than 350, is more preferably less than 200 and, especially, is less than 100:

polyethylene glycol HO—$(CH_2CH_2O—)_y$—H; polyoxyalkylene alkyl ether $RO(C_rH_{2r}O)_yH$; polyoxyalkylene alkyl esters; polyoxyalkylene alkylphenyl ether

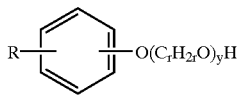

polyoxyethylene polystyrylphenyl ether

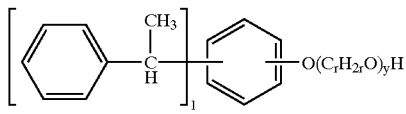

polyoxyethylene-polypropylene glycol

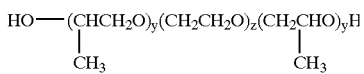

(including both block polymers and random polymers); polyoxyethylene-polyoxypropylene alkyl ether (forming alkyl ether at the end of the molecule; including random polymers);

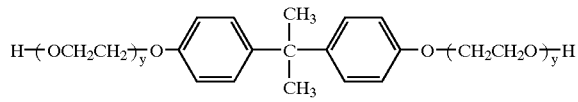

ethylene oxide derivatives of alkylphenol-formaldehyde condensate

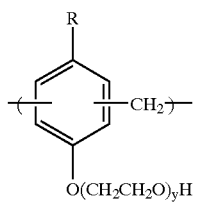

polyoxyethylene-polyhydric alcohol fatty acid partial esters such as

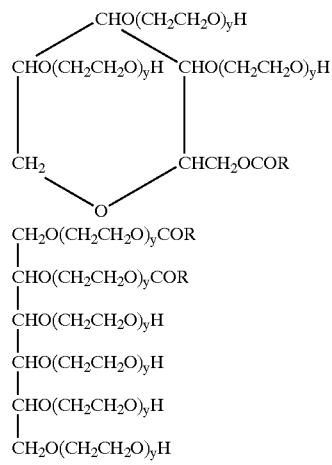

polyoxyethylene fatty acid esters such as RCOO$(CH_2CH_2O)_yH$; polyoxyethylene alkyl amines

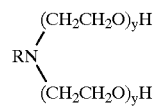

an alkylene oxide adduct of castor oil, hardened castor oil, lanolin, lanolin alcohol, beeswax phytosterol or phytostanol; and polyoxyalkylene sorbitol fatty acid esters and/or ethers, for example sorbitol fatty acids or of polyoxypropylene sorbitol fatty acids or of polyoxyethylene-polyoxypropylene sorbitol fatty acids.

Preferably, compounds of group (A) are selected from polyoxyethylene sorbitol hexastearate, polyoxyethylene sorbitol tetrastearate, polyoxyethylene sorbitol tetraoleate, polyoxyethylene sorbitol hexaoleate, polyoxyethylene sorbitol monooleate, polyoxyethylene sorbitol monolaurate, polyoxyethylene sorbitol tetralaurate, polyoxyethylene sorbitol hexalaurate, polyoxypropylene sorbitol hexastearate, polyoxypropylene sorbitol tetraoleate, polyoxypropylene sorbitol hexaoleate, polyoxypropylene sorbitol monolaurate, polyoxyethylene-polyoxypropylene sorbitol hexastearate, polyoxyethylene-polyoxypropylene sorbitol tetrastearate, polyoxyethylene-polyoxypropylene sorbitol monooleate, polyoxyethylene-polyoxypropylene sorbitol tetraoleate, polyoxyethylene sorbitol hexastearyl ether, polyoxyethylene sorbitol tetrastearyl ether, polyoxyethylene sorbitol tetraoleyl ether, polyoxyethylene sorbitol monolauryl ether and polyoxyethylene sorbitol monooleyl ether, polyoxyethylene lauryl ether, polyoxyethylene cetyl ether, polyoxyethylene stearyl ether, polyoxyethylene oleyl ether, polyoxyethylene higher alcohol ether, polyoxyethylene octylphenyl ether, polyoxyethylene nonylphenyl ether, polyoxyethylene sorbitan monolaurate, polyoxyethylene sorbitan monopalmitate, polyoxyethylene sorbitan monostearate, polyoxyethylene sorbitan tristearate, polyoxyethylene sorbitan monooleate, polyoxyethylene sorbitan trioleate, polyoxyethylene sorbitol tetraoleate, polyethylene glycol monooleate, polyethylene glycol distearate, polyoxyethylene nonylphenyl ether-formaldehyde condensate, oxyethylene-oxypropylene block copolymer, polyethylene glycol, tetraethylene glycol, polyoxyethylene stearyl ether, polyoxyethylene sorbitol lauryl ester, and polyoxyethylene castor oil.

Compounds in group (B) include siloxanes substituted by one or more optionally-substituted alkyl or phenyl groups.

Said siloxane may be linear, cyclic or complex cross-linked. Preferred siloxanes are phenylalkylsiloxanes and dialkylsiloxanes.

Preferred compounds in group (B) include a unit of formula

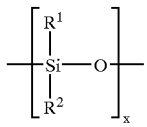

wherein $R^1$ and $R^2$ independently represent an optionally-substituted, especially an unsubstituted, alkyl or phenyl group and x represents an integer.

x may be at least 2, preferably at least 10, more preferably at least 20. x may be less than 100, preferably less than 60.

Compounds in group (B) may be polysiloxanes which include units of formula I and II. The molecular weights of such polysiloxanes may be in the range 1800 to 40,000, preferably in the range 3500 to 16000. Preferred polysiloxanes include a copolymer of dimethyldichlorosilane, ethylene oxide and propylene oxide suitably having a viscosity of 9 cm$^2$/second at 25° C. and a surface tension of 18 mN/m; a copolymer of dimethyldichlorosilane and ethylene oxide, suitably comprising about 15 to 25 siloxane units and 50 to 70 oxyethylene units in each molecule and having an average molecular weight of about 5,000; a copolymer of dimethyldichlorosilane and propylene oxide having an average molecular weight of 7,000; and a copolymer containing in its molecule 25 to 40 dimethylsiloxane units, 120 to 150 oxyethylene units and 80 to 100 oxypropylene units and having an average molecular weight of about 13,500.

Compounds. in group (C) include esters, ethers and amides of polyhydric alcohols. Preferred polyhydric alcohols are of general formula

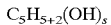

$C_sH_{s+2}(OH)_s$ wherein s is in the range 2 to 20, preferably 4 to 10. An especially preferred polyhydric alcohol is sorbitol.

Compounds in group (C) may include esters, ethers and amides of polyhydric alcohols and moieties having 2 to 30, preferably 4 to 25, more preferably 6 to 20 carbon atoms. Preferred esters are selected from laurates, palpitates, stearates and oleates. Preferred ethers are selected from lauryl, cetyl, stearyl, oleyl and phenyl ethers. Preferred amides are fatty acid alkanolamides, with lauryl ethanolamide being especially preferred.

Compounds in group (C) may comprise any of the compounds described above for group A, but excluding the polyalkylene oxide unit of such compounds.

Said heat sensitive composition and said developer resistance means of said precursor may not necessarily, together, define a single homogenous layer. Said precursor may include at least some developer resistance means at or towards an upper surface thereof.

Whilst the applicants do not wish to be limited by any theoretical explanation of how the '862 invention operates, it is believed that the presence of at least part of the developer resistance means at an uppermost surface of the precursor may be a key factor. Thus, preferably, the precursor includes an upper surface (which is suitably contacted by developer during development) which includes some of said developer resistance means. Such a surface may be a component of a layer which also includes said heat sensitive composition. In this case, the precursor may be prepared using a mixture comprising said heat sensitive composition and said developer resistance means. It is believed that, at some stage, at least part of the developer resistance means separates from the heat sensitive composition and migrates to the surface. Thus, resistance to developer attack appears to be manifested particularly at the surface of precursors of the present invention. Dynamic contact angle studies (using a Cahn Dynamic Contact Angle Analyzer) have clearly showed a marked effect at the surface of precursors described herein. For example, a typical positive working lithographic printing plate precursor has advancing and receding contact angles in water of approximately 95° and 48° respectively, whereas a precursor comprising a heat sensitive composition and a developer resistance means of, for example, a phenyl methyl polysiloxane (applied to the substrate as a mixture) has advancing and receding contact angles in water of approximately 95° and 67° respectively. A surface of the same phenyl methyl polysiloxane alone provided on the same substrate has advancing and receding contact angles in water of approximately 95° and 67° respectively. Thus, the surface of the precursor is of a nature similar to that of the polysiloxane coated as a single component.

Where the developer resistance means is provided in a single layer with the heat sensitive composition and/or in a separate layer, the sum of the amounts of compounds selected from groups (A), (B) or (C) in said single layer and a said separate layer may be at least 0.3 wt %, suitably-at least 1 wt %, preferably at least 1.5 wt %, more preferably at least 2 wt %, especially at least 3 wt %. The sum of the amounts may be 10 wt % or less, suitably 8 wt % or less, preferably 7 wt % or less, more preferably 6 wt % or less.

The heat sensitive compositions of the '862 invention are heat-sensitive in that localised heating of the compositions, preferably by suitable radiation, causes an increase in the aqueous developer solubility of the exposed areas.

Said developer resistance means is preferably non-radiation sensitive. More particularly, said developer resistance means is preferably not heat and/or light and/or UV sensitive.

According to a second aspect of the '862 invention, there is provided a precursor for preparing a resist pattern by heat mode imaging, the precursor comprising:

a heat sensitive composition, the solubility of which in an aqueous developer is arranged to increase in heated areas, where in said composition comprises an aqueous developer soluble polymeric substance (referred to above as the "active polymer") and a compound which reduces the aqueous developer solubility of the polymeric substance (referred to above as the "reversible insolubiliser compound"); and a surfactant;

wherein the aqueous developer solubility of the composition is increased on heating and the aqueous developer solubility of the composition is not increased by incident UV radiation.

The "heat sensitive composition" of the '862 invention may be any of the various heat sensitive compositions defined hereinabove, to which the present invention can be applied. This '862 invention involves the inclusion of a said developer resistance means, as a component of any of the aforementioned heat mode compositions. The simple test methods described above in relation to those inventions may be used to determine the likely suitability of a composition of the '862 invention, as a printing form coating.

That concludes the general description of our co-filed invention entitled "Pattern Formation" to which the present invention can be applied.

In accordance with a second aspect of the present invention there is provided a printing form precursor manufactured by a method as previously defined. The coating preferably comprises a phenolic resin composition which is to be patternwise exposed by heat. Many examples are given above.

In accordance with a third aspect of the invention there is provided a method of producing a printing form, from a printing form precursor of the second aspect, comprising an exposure step of exposing selected areas of the composition such as to render them developer soluble, followed by development in a developer to remove said selected areas. The exposure preferably entails heating the selected areas. The heating of selected areas may be effected in the different ways applicable to the different compositions, as described above.

In accordance with a fourth aspect of the invention there is provided a printing form produced by the method of the third invention.

The following Examples more particularly serve to illustrate various embodiments of the present invention described hereinabove.

Starting Materials

The following are referred to hereinafter.

Resin A: LB6564—a 1:1 phenol/cresol novolak resin supplied by Bakelite, UK.

Resin B: LB744—a cresol novolak resin supplied by Bakelite.

Resin C: LB6564 phenolic resin modified by simple reaction with p-toluene sulphonyl chloride as follows.
1. Dissolve LB 6564 (25.0 g) resin (Resin A) in 61.8 g of 2-methoxyethanol.
2. Immerse a three-necked 500 ml round-bottomed flask in a water bath placed on a hot plate/stirrer. Attach a stirrer gland, stirring rod and a thermometer to the flask.
3. Place the resin solution into the flask and begin rapid stirring.
4. Slowly add 25.6 g of distilled water drop-wise keeping precipitation to a minimum.
5. Add sodium hydrogen carbonate (4.3 g) to the flask. Not all of the solid will dissolve.
6. Slowly add the acid chloride (1.18 g) with vigorous stirring.
7. Warm the reaction mixture for 6 hours at 40° C. with stirring.
8. After 6 hours, remove the flask from the water bath and allow to cool (about 30 mins).
9. Prepare a dilute solution by adding 8.6 g of 1.18 s.g. hydrochloric acid to 354 g of distilled water.
10. Slowly precipitate the esterified resin drop-wise into the dilute acid with stirring.
11. Filter and wash the precipitate by re-slurrying in distilled water at least three times if possible until the pH of the filtrate reaches 6.0.
12. Dry the precipitate in a vacuum oven at 40° C. 75% yield. Identity confirmed by IR spectroscopy.

Resin D: Methylol polyvinyl phenol, believed to have the structure:

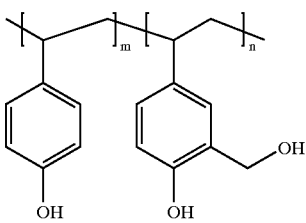

Resin E: Uravar FN6, an alkyl phenolic resole resin as supplied by DSM Resins UK, South Wirral, UK.

Resin F: LG 724, a phenol novolak resin supplied by Bakelite, UK.

Resin G: LB6564 phenolic resin modified by simple reaction with 214-NQD chloride as follows.
1. Dissolve LB 6564 (25.0 g) resin (Resin A) in 61.8 g of 2-methoxyethanol.
2. Immerse a three-necked 500 ml round-bottomed flask in a water bath placed on a hot plate/stirrer. Attach a stirrer gland, stirring rod and a thermometer to the flask.
3. Place the resin solution into the flask and begin rapid stirring.
4. Slowly add 25.6 g of distilled water drop-wise keeping precipitation to a minimum.
5. Add sodium hydrogen carbonate (4.3 g) to the flask. Not all of the solid will dissolve.
6. Slowly add the acid chloride (4.5 g) with vigorous stirring.
7. Warm the reaction mixture for 6 hours at 40° C. with stirring.
8. After 6 hours, remove the flask from the water bath and allow to cool (about 30 mins).
9. Prepare a dilute solution by adding 8.6 g of 1.18 s.g. hydrochloric acid to 354 g of distilled water.
10. Slowly precipitate the esterified resin drop-wise into the dilute acid with stirring.
11. Filter and wash the precipitate by re-slurrying in distilled water at least three times if possible until the pH of the filtrate reaches 6.0.
12. Dry the precipitate in a vacuum oven at 40° C. 75% yield. Identity confirmed by IR spectroscopy.

(214-NQD chloride—the compound

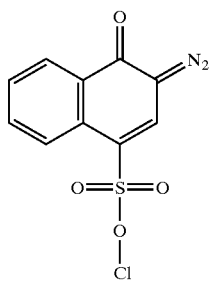

supplied by A. H. Marks, Bradford, UK).

Resin H: Durite PD-494A, a cresylic resin supplied by Borden, Columbus, Ohio, USA.

Dye A—KF654B PINA as supplied by Riedel de Haan UK, Middlesex, UK, believed to have the structure:

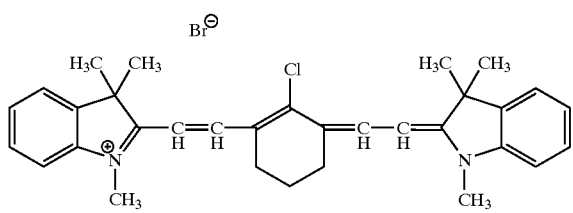

Dye B—crystal violet (basic violet 3, C.I. 42555, Gentian Violet) as supplied by Aldrich Chemical Company, Dorset, UK, having the structure:

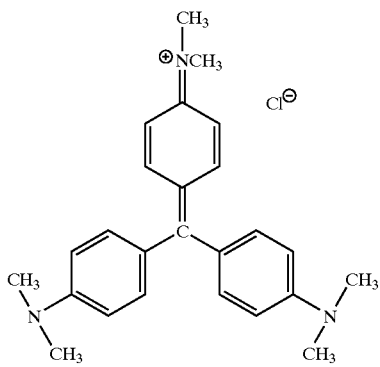

Dye C—I-1-62L as supplied by H. W. Sands of Jupiter, Fla., USA, believes to have the structure:

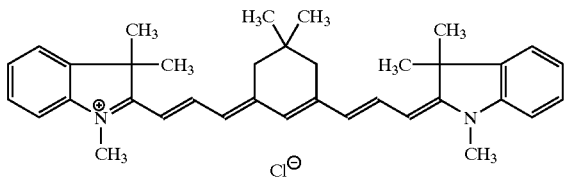

Dye D—Ethyl violet (Basic Violet 4, C.I. 42600) as supplied by Aldrich Chemical Company, Dorset, UK, having the structure:

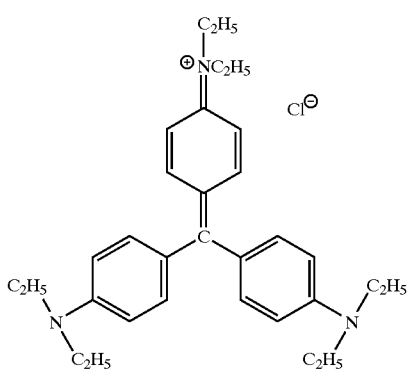

Dye E—SDB7047, having the structure:

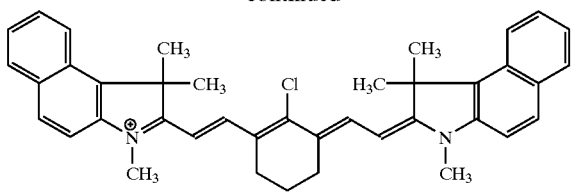

as supplied by H. W. Sands, Jupiter, Fla., USA.

Monazoline C—a cocyl imidazoline, supplied by Mona Industries Inc, New Jersey, USA, believed to have the structure:

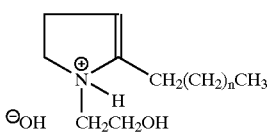

Acid Generator A—diphenyliodonium hexafluorophosphate,

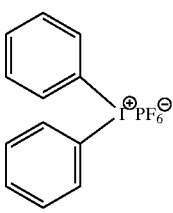

supplied by Avocado Research Chemicals Ltd, Heysham, Lancashire, UK.

Silikophen P50X—a phenyl methyl siloxane as supplied by Tego Chemie Service GmbH of Essen, Germany.

Carbon black FW2—a channel type carbon black as supplied by Degussa, of Macclesfield, UK.

Prussian blue—ferric ferrocyanide, CI pigment Blue 27, supplied by Aldrich.

Developer A—14% wt sodium metasilicate pentahydrate in water.

Developer B—7% wt sodium metasilicate pentahydrate in water.

Substrate A—0.3 mm sheet aluminium electrograined and anodised and post-anodically treated with an aqueous solution of an inorganic phosphate.

Exposure Test Methods

Printing plate precursors made according to the Examples 1 to 11 below were imaged in a commercially available image setter, the Trendsetter 3244 using Procomm Plus software, operating at a wavelength of 830 nm at powers of up to 8 W and supplied by Creo Products Inc. of Burnaby, Canada.

For Examples 12 to 14 below the coated substrate to be imaged was cut into a circle of 105 mm diameter and placed on a disc that could be rotated at a constant speed of 2500 revolutions per minute. Adjacent to the spinning disc a translating table held the source of the laser beam so that the laser beam impinged perpendicularly onto the coated substrate, while the translating table moved the laser beam radially in a linear fashion with respect to the spinning disc. The exposed image was in the form of a spiral whereby the image in the centre of the spiral represented slow laser scanning speed and long exposure time and the outer edge of the spiral represented fast scanning and short exposure time.

The laser used was a single mode 830 nm wavelength 200 mW laser diode which was focused to a 10 micron spot. The laser power supply was a stabilised constant current source.

EXAMPLE 1

The coating formulation for example 1, as described below, was prepared as a solution in 1-methoxypropan-2-ol/xylene 98:2 (w:w). The coating solutions were coated onto Substrate A by means of a wire wound bar. The solution concentrations were selected to provide the specified dry film compositions with a coating weight of 2.5 $gm^{-2}$ after thorough drying at 100° C. for 3 minutes in a Mathis labdryer oven as supplied by Werner Mathis AG, Germany.

| Component | Example 1 Parts by Weight |
|---|---|
| Resin A | 70 |
| Resin B | 20 |
| Dye A | 2 |
| Dye B | 2 |
| Silikophen P50X | 6 |

Individual plate samples were then covered with interleaving (a polythene coated paper No. 22, 6 $gm^{-2}$ as supplied by Samuel Grant, U.K.), wrapped in paper (unbleached, unglazed Kraft 90 $gm^{-2}$, coated with matt black low density polythene 20 $gm^{-2}$ as supplied by Samuel Grant, U.K.) and placed in an Gallenkamp hotbox oven with fan, size 2, as supplied by Sanyo Gallenkamp plc of Leicester, U.K., at 50° C. for 0, 2, 3, 5 and 12 days respectively.

The resulting heat treated plates were imaged using the Creo Trendsetter at 7 watts with a 50% screen image at imaging energy densities of 120, 140, 160, 180, 200 and 220 $mJcm^{-2}$. The plates were developed using a Horsell Mercury Mark V plate processor containing developer A at 22° C. The processing speed was set at 1000 mm $min^{-1}$. Finally, images produced were evaluated visually and the energy required to produce a 50% imaged plate was recorded ($mJcm^{-2}$).

|  | Number of days plates having resided in oven at 50° C. | | | | |
|---|---|---|---|---|---|
|  | 0 | 2 | 3 | 5 | 12 |
| Energy required to produce 50% image/$mJcm^2$ | No coating retained | 140–160 | 160–180 | 160–180 | 160–180 |

EXAMPLE 2

A coating formulation for example 2 as described below, was prepared as a solution in 1-methoxypropan-2-ol/xylene 98:2 (w:w). The formulation was coated as described in example 1 onto Substrate A to provide the specified dry film composition with a coating weight of 2.0 $gm^{-2}$ after thorough drying at 130° C. for 80 seconds in a Mathis labdryer oven.

| Component | Example 2 Parts by weight |
|---|---|
| Resin A | 90 |
| Dye A | 4 |
| Dye B | 3 |
| Silikophen P50X | 3 |

Individual plate samples were then wrapped in paper (unbleached, unglazed Kraft 90 $gm^{-2}$, coated with matt black low density polythene 20 $gm^{-2}$) and placed in a Gallenkamp hotbox oven with fan, size 2, under the following conditions.

| Temperature/° C. | Time |
|---|---|
| 50 | 1, 20, 28, 48 hours |
| 85 | 0.25, 0.5, 1, 2, 24, 48 hours |
| 110 | 0.25, 0.5, 0.75, 25, 48 hours |
| 140 | 2, 4, 6, 8, 10, 12, 300, 600 minutes |

The resulting heat treated plates were then imaged at 8 watts with a 50% screen image using the Creo Trendsetter as described previously at an imaging energy density of 200 $mJcm^{-2}$. The plates were then developed using a Horsell Mercury Mark V plate processor containing developer A at 22° C. The processing speed was set at 700 mm $min^{-1}$. Finally images produced were read using a Tobias plate check densitomer as supplied by Tobias Associates Inc. of Ivyland, Pa., U.S.A. and are expressed in the following table.

Densitometer Readings for Example 2

| | \multicolumn{17}{c}{Time of heat treatment (hours)} | | | | | | | | | | | | | | | | |
|---|---|---|---|---|---|---|---|---|---|---|---|---|---|---|---|---|---|
| | 0.03 | 0.07 | 0.1 | 0.13 | 0.17 | 0.2 | 0.3 | 0.5 | 0.8 | 1 | 2 | 5 | 10 | 20 | 24 | 28 | 48 |
| 50° C. | | | | | | | | | | 45% | | | | 48% | | 57% | 54% |
| 85° C. | | | | | | | 43% | 46% | | 47% | 50% | | | | 52% | | 55% |
| 110° C. | | | | | | | 36% | 42% | 43% | | | | | | 80% | | 85% |
| 140° C. | 36% | 52% | 65% | 70% | 71% | 78% | | | | | | 100% | 100% | | | | |

EXAMPLE 3

The coating formulation of example 1 was prepared as a solution in 1-methoxypropan-2-ol/xylene 98:2 (w:w). The formulation was reverse roller coated onto Substrate A. The solution concentration was selected to provide the specified dry film composition with a coating weight of 2.5 gm$^{-2}$, after thorough drying at 140° C. for 30 seconds in an air flotation oven.

Plates were individually wrapped in paper (unbleached, unglazed Kraft 90 gm$^{-2}$, coating with matt black low density polythene 20 gm$^{-2}$) and placed in a Gallenkamp hotbox oven with fan, size 2 at 50° C. for 0, 17, 24 and 70 hours. The resulting heat treated plates were then imaged at 8 watts with a 50% screen image using the Creo Trendsetter as described previously at an imaging energy density of 180 mJcm$^{-2}$. The plates were developed using a Horsell Mercury Mark V plate processor containing developer A at 22° C. The processing speed was set at 1000 mm min$^{-1}$. Finally, images produced were read using the Tobias plate check densitometer.

Densitometer readings of 50% screen images exposed by the Creo Trendsetter were as follows.

| | \multicolumn{4}{c}{Number of hours plates have resided in oven} | | | |
|---|---|---|---|---|
| | 0 | 17 | 24 | 70 |
| Densitometer Reading | 0% | 47% | 52% | 52% |

EXAMPLE 4

In this example both the coating and the heat treatment steps used factory rather than laboratory equipment.

The coating formulation of example 1 was prepared as a solution in 1-methoxypropan-2-ol/xylene 98:2 (w:w). The formulation was reverse roller coated onto Substrate A. The solution concentration was selected to provide the specified dry film composition with a coating weight of 2.5 gm$^{-2}$, after thorough drying at 110° C. for 75 seconds in a hot air displacement oven.

Plates were then placed in a hot air displacement oven at 50° C. for 49.5 hours. The resulting heat treated plates were then imaged at 8 watts with a 50% screen image using the Creo Trendsetter as described previously at an imaging energy density of 120, 140, 160, 180, 200 and 220 mJcm$^{-2}$. The plates were then developed using a Horsell Mercury Mark V plate processor containing developer A at 22° C. The processing speed was set at 1000 mm min$^{-1}$.

Finally, images produced were evaluated visually and the energy required to produce a 50% image was recorded as 180 mJcm$^{-2}$.

EXAMPLES 5–8

Coating formulations set out below were prepared as a solution in 1-methoxypropan-2-ol/xylene 98:2 (w:w). The formulations were coated as described in example 1 onto Substrate A to provide the specified dry film composition with a coating weight of 2.0 gm$^{-2}$ after thorough drying at 100° C. for 3 minutes in a Mathis labdryer oven.

| | Ex. 5 | Ex. 6 | Ex. 7 | Ex. 8 |
|---|---|---|---|---|
| Resin A | 93.5 | 92.5 | 91 | 92 |
| Monazoline C | 1 | 1 | 2.5 | 0 |
| Dye C | 2 | 3 | 3 | 4 |
| Dye D | 0.5 | 0.5 | 0.5 | 1 |
| Silikophen P50X | 3 | 3 | 3 | 3 |

Plates were individually covered with interleaving (a polythene coated paper 6 gm$^{-2}$), wrapped in paper (unbleached, unglazed Kraft 90 gm$^{-2}$, coated with matt black low density polythene 20 gm$^{-2}$) and placed in a Gallenkamp hotbox oven with fan, size 2 under the following conditions:

| Temperature (° C.) | Residence time (days) |
|---|---|
| 50 | 0, 2, 5 |

The resulting heat treated plates were then imaged at 8 watts with a 50% screen image using the Creo Trendsetter as described previously at an imaging energy density of 500 mJcm$^2$. The plates were developed using a Horsell Mercury Mark V plate processor containing developer A at 22° C. The processing speed was set at 700 mm min$^{-1}$. Finally, images produced were read using the Tobias plate check densitomer.

Densitometer readings of 50% images exposed by the Creo Trendsetter were as follows:

| | \multicolumn{3}{c}{Number of hours plates have resided in oven at 50° C.} | | |
|---|---|---|---|
| | 0 | 2 | 5 |
| Example | | | |
| 5 | 0 | 52 | 51 |
| 6 | 18 | 52 | 51 |
| 7 | 42 | 57 | 56 |
| 8 | 14 | 50 | 50 |

EXAMPLE 9

A coating formulation identical to that of example 1 was prepared as a solution in 1-methoxypropan-2-ol/xylene 98:2 (w:w). The formulations were coated onto Substrate A as described in example 1 to provide the specified dry film composition with a coating weight of 2.0 gm$^{-2}$ after thorough drying at 130° C. for 80 seconds in a Mathis labdryer oven.

Plate samples were then either:
1. covered with interleaving (a polythene coated paper, 6 gm$^{-2}$), and then wrapped as a 13 plate packet in paper (unbleached, unglazed Kraft 90 gm$^{-2}$, coated with matt black low density polythene 20 gm$^{-2}$)
or 2. left un-interleaved but wrapped as a 13 plate packet in paper (unbleached, unglazed Kraft 90 gm$^{-2}$, coated with matt black low density polythene 20 gm$^{-2}$)

and placed in a Gallenkamp hotbox oven with fan, size 2, for various times (0 to 80 hours) at 50° C. The resulting heat treated plates were then imaged with 50% screen images using the Creo Trendsetter as described previously at an imaging energy density of 200 mJcm$^{-2}$. The plates were developed using a Horsell Mercury Mark V plate processor containing developer A at 22° C. The processing speed was set at 700 mm min$^{-1}$. Finally, images produced were read using the Tobias plate check densitometer. The results are expressed in the table below.

Densitometer Readings for Example 9

| | Time of heat treatment (hours) | | | | | | | | | | | | | |
|---|---|---|---|---|---|---|---|---|---|---|---|---|---|---|
| | 4 | 6 | 9 | 18 | 24 | 28 | 32 | 45 | 48 | 50 | 52 | 57 | 60 | 75 |
| not interleaved | 20% | 32% | | 47% | 47% | 47% | | 49% | | | | | 50% | 50% |
| interleaved | | 34% | 42% | | 48% | | 50% | | 50% | 50% | 50% | 51% | | 51% |

EXAMPLE 10

A coating formulation set out below was prepared as described in example 1 as a solution in 1-methoxypropan-2-ol/xylene 98:2 (w:w). The formulation was coated onto Substrate A as described in example 1 to provide the specified dry film composition with a coating weight of 2.0 gm$^{-2}$ after thorough drying at 100° C. for three minutes in a Mathis labdryer oven.

| Component | Example 10 Parts by Weight |
|---|---|
| Resin C | 96 |
| Dye A | 2 |
| Dye B | 2 |

Individual plate samples were then covered with interleaving (a polythene coated paper 6 gm$^{-2}$), wrapped in paper (unbleached, unglazed Kraft 90 gm$^{-2}$, coated with matt black low density polythene 20 gm$^{-2}$) and placed in a Gallenkamp hotbox oven with fan, size 2, for various times (0 to 17 days) and temperatures (room temperature to 50° C). The resulting heat treated plates were then imaged with 50% screen images using the-Creo Trendsetter as described previously at an imaging energy density of 200 mJcm$^{-2}$. The plates were developed using a Horsell Mercury Mark V plate processor containing developer A at 22° C. The processing speed was set at 500 and 1500 mm min$^{-1}$. Finally, images produced were read using the Tobias plate check densitomer. The densitometer readings are given in the tables below.

Results for Plates Heat Treated at 40° C.

| | | Number of days plates have resided in oven | | | | |
|---|---|---|---|---|---|---|
| | | 0 | 4 | 6 | 8 | 10 |
| Processing Speed mm min$^{-1}$ | 500 | 0% | 51% | 52% | 64% | 65% |
| | 1500 | 0% | 71% | 73% | 72% | 67% |

Results for Plates Heat Treated at 50° C.

| | | Number of days plates have resided in oven | | | | |
|---|---|---|---|---|---|---|
| | | 0 | 1 | 2 | 3 | 10 |
| Processing Speed mm min$^{-1}$ | 500 | 0% | 53% | 47% | 47% | 68% |
| | 1500 | 0% | 72% | 70% | 67% | 83% |

Results for Plates Treated at Room Temperature

| | | Number or days plates have resided in oven | | | |
|---|---|---|---|---|---|
| | | 0 | 5 | 12 | 17 |
| Processing Speed mm min$^{-1}$ | 500 | 0% | 10% | 22% | 41% |
| | 1500 | 0% | 18% | 47% | 60% |

It should be noted that example 10 gives the results of preliminary tests on the compositions containing Resin C and the heat treatment conditions were far from optimised. However we believe the results show that a temperature above room temperature will be required to get good stability, and that heat treatment at a temperature of at least 40° C. for 1–6 days is likely to yield adequately stable compositions.

EXAMPLE 11

The coating formulation for example 11 was ball milled together for 24 hours in 1-methoxypropan-2-ol. The coating solution was coated onto Substrate A by means of a wire wound bar. The solution concentration was selected to provide the specified dry film composition with a coating weight of 2.5 gm$^{-2}$ after thorough drying at 100° C. for 3 minutes in a Mathis lab dryer oven.

| Component | Example 11 Parts by Weight |
|---|---|
| FW2 | 12 |
| Resin B | 88 |

Individual plate samples were then wrapped in paper (unbleached, unglazed Kraft 90 gm$^{-2}$, coated with matt black low density polyethylene 20 gm$^{-2}$) and 1) stored at room temperature for 0, 1, 2, and 4 days or 2) placed in a Gallenkamp hotbox oven with fan, size 2 at 55° C. for 0, 1, 2 and 4 days.

The resulting heat treated plates were imaged using the Creo Trendsetter at 7 watts with a 50% screen image at imaging energy densities of 150, 200, 250 and 300 mJcm$^{-2}$. The plates were developed using a Horsell Mercury Mark V plate processor containing developer A at 22° C. The processing speed was set at 750 mm min$^{-1}$. Finally, images produced were evaluated visually and the energy required to produce a 50% image was recorded.

|  | Parts by Weight Example | | |
|---|---|---|---|
| Component | 12 | 13 | 14 |
| Dye B | | | 2 |
| Resin G | | | 76 |

Individual plate samples were then covered with interleaving (a polythene coated paper, 6 gm$^{-2}$) wrapped in paper (unbleached, unglazed Kraft 90 gm$^{-2}$, coated with matt black low density polythene 20 gm$^{-2}$) and either:

1) placed in a Gallenkamp hotbox oven with fan, size 2, at 50° C. for 2 days or 2) stored at room temperature for 2 days.

The plates were then imaged using the rotating disc apparatus as described previously. The exposed plates were developed by immersing in developer A at 20° C. for example 13 and developer B at 20° C. for examples 12 and 14, which removed the imaged coating areas leaving a spiral image. The immersion time required to leave an image having an imaging energy density of 120 mJcm$^{-2}$ are given in the first column of the table below.

In addition, plate samples of example 12 were tested for developability by immersing in developer B at 20° C. for an

| | Imaging Energy Density/mJcm$^{-2}$ | | | | | | | | | | | | | | | |
|---|---|---|---|---|---|---|---|---|---|---|---|---|---|---|---|---|
| | 150 | | | | 200 | | | | 250 | | | | 300 | | | |
| Age of plate/days | 0 | 1 | 2 | 4 | 0 | 1 | 2 | 4 | 0 | 1 | 2 | 4 | 0 | 1 | 2 | 4 |
| Plates placed in oven | 5% | 33% | 35% | 47% | 0% | 27% | 30% | 44% | 0% | 26% | 32% | 40% | 0% | 14% | 39% | 40% |
| Plates stored at room temp. | 0% | 0% | 0% | 0% | 0% | 0% | 0% | 0% | 0% | 0% | 0% | 0% | 0% | 0% | 0% | 0% |

EXAMPLES 12 to 14

Coating formulations were prepared as described in example 1 as solutions in 1-methoxypropan-2-ol/dimethylformamide 50:50 (w:w) for examples 12 and 13 and as solutions in 1-methoxypropan-2-ol for Example 14. The formulations were coated as previously described onto Substrate A to provide the specified dry film composition with coating weights of 1.2 gm$^{-2}$ for examples 12 and 13, and a coating weight of 2.5 gm$^{-2}$ for example 14, after thorough drying at 130° C. for 80 seconds in a Mathis labdryer oven.

| | Parts by Weight Example | | |
|---|---|---|---|
| Component | 12 | 13 | 14 |
| Resin A | 42 | 42 | |
| Resin D | 42 | | |
| Acid Generator A | 12 | 12 | |
| Dye E | 4 | 4 | |
| Resin E | | 42 | |
| Resin F | | | 20 |
| Dye A | | | 2 | appropriate time and plate samples of examples 13 and 14 were tested for developability by immersing in developer A at 35° C. for an appropriate time. The second column in the following table lists the results of these simple developability tests for the compositions.

| | | Immersion time required/seconds | Time to fully remove coating/seconds |
|---|---|---|---|
| Example 12 | Samples placed in oven | 60 | 35 |
| | Samples stored at room temperature | 30 | 3 |
| Example 13 | Samples placed in oven | 120 | 120 |
| | Samples stored at room temperature | 60 | 90 |
| Example 14 | Samples placed in oven | 40 | 45 |
| | Samples stored at room temperature | 30 | 15 |

For example 15 Prussian Blue and resin B (at a ratio of 1:4, w:w) were ball milled together for four days such that the dispersed mill-base had a solids content of 30% in 1-methoxy-2-propyl acetate and a particle size of <10 microns as determined by grind gauge.

For example 16, Prussian blue and resin H were ball milled as described above.

For example 17, Carbon black FW2 and resin B were ball milled as described above.

The coating formulations then for examples 15–17 were prepared as solutions in 1-methoxy propan-2-ol:1-methoxy-2-propyl acetate (50:50 w:w).

The coating solutions were coated onto Substrate A by means of a wire wound bar.

The solution concentrations were selected to provide the specified dry film compositions with coating weights of 2.5 $gm^{-2}$ after thorough drying at 110° C. for 90 seconds, in a Mathis labdryer oven.

|  | Examples | | |
| --- | --- | --- | --- |
| Component | 15 | 16 | 17 |
| Resin A | 48 | | |
| Resin B | 40 | | 88 |
| Resin C | | 88 | |
| Prussian Blue | 12 | 12 | |
| Carbon Black FW2 | | | 12 |

Individual plate samples were then covered with interleaving (a polythene coated paper No. 22, 6 $gm^{-2}$ as supplied by Samuel -Grant UK), wrapped in paper (unbleached, unglazed Kraft 90 $gm^{-2}$), coated with matt black low density polythene (20 $gm^{-2}$ as supplied by Samuel Grant, UK), and placed in a Gallenkamp hotbox oven with fan, size 2, as supplied by Sanyo Gallenkamp, at 55° C. for 4 days.

Plate samples were then imaged on the Trendsetter 3244, using the internal test pattern, plot 0 (50% screen) at 10W, 200 $mJcm^{-2}$, 127 rpm.

The exposed samples were then processed by immersing in developer B at 21° C. for an appropriate time as described below. Other samples were processed using a Horsell Mercury Mark V processor filled with Developer A at 22.5° C. and having a plate speed of 1500 mm/min. The images (written as 50% dots) were measured using a Tobias plate check densitometer as supplied by Tobias Associates Inc, of Ivyland, Pa., USA.

|  | Processing by Immersion | | Processing using Mercury Mark V |
| --- | --- | --- | --- |
| Example | Time/seconds | Written 50% dots | Written 50% dots |
| 15 | 15 | 52% | 47% |
| 16 | 30 | 46% | 67% |
| 17 | 15 | 47% | 52% |

In the specification we refer in various places to UV, infra-red and visible radiation. A person skilled in the art will be aware of the typical wavelength ranges of these radiations. However, for the avoidance of any doubt, UV radiation typically has a wavelength range not exceeding about 450 nm (by which we mean insubstantial above 450 nm). Visible radiation has a wavelength range of about 400 to 700 nm. Infra-red radiation typically has a wavelength range in excess of 600 nm, the boundaries between UV and visible radiation, and between infra-red and visible radiation, not being sharp ones.

The reader's attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying claims, abstract and drawings), or to any novel one, or any novel combination, of the steps of any method or process so disclosed.

What is claimed is:

1. A method of manufacturing a printing form precursor which comprises a coating on a substrate, the coating comprising an aqueous alkaline developer-soluble positive working composition which comprises a phenolic resin and a compound which reduces the aqueous alkaline developer solubility of the phenolic resin, wherein the method of manufacturing comprises the application of the composition in a solvent to the substrate, the drying of the composition, and the subsequent heat treatment of the coated substrate, wherein the heat treatment is carried out for at least 4 hours, and the aqueous alkaline developer solubility of the composition is not increased by incident UV radiation.

2. A method as claimed in claim 1, wherein the heat treatment is carried out at a temperature in the range 40–90° C.

3. A method as claimed in claim 2, wherein the heat treatment is carried out in the range 45–85° C.

4. A method as claimed in claim 3, wherein the heat treatment is carried out in the range 50–60° C.

5. A method as claimed in claim 1, wherein the heat treatment is carried out for at least 24 hours.

6. A method as claimed in claim 1, wherein the drying of the composition is carried out by subjecting the substrate carrying the composition in a solvent to a temperature exceeding the temperature selected for the heat treatment, and for a period of time less than that selected for the heat treatment.

7. A method as claimed in claim 1, wherein the drying of the composition is carried out by subjecting the substrate carrying the composition in a solvent to a temperature in excess of 70° C. for a period of time of at least 15 seconds (but sufficient to render the composition self-supporting) but not exceeding 600 seconds.

8. A method as claimed in claim 1, wherein the heat treatment is such that the sensitivity reduction of said heat treated composition over a one year period after the heat treatment does not exceed 15%.

9. A method as claimed in claim 8, wherein the said reduction does not exceed 10%.

10. A method as claimed in claim 1, wherein the composition is such that its solubility in a developer is not increased by incident UV radiation.

11. A method as claimed in claim 1, wherein the composition does not contain diazide moieties.

12. A method as claimed in claim 1, wherein said composition is such that it may be patternwise exposed by direct heat, or by charged particle radiation or electromagnetic radiation, in each case converted to heat by the coating.

13. A method as claimed in claim 12, wherein the composition is such that the radiation to which it is sensitive is of wavelength entirely or predominantly exceeding 450 nm.

14. A method as claimed in claim 13 wherein the composition is such that the radiation to which it is sensitive is of wavelength entirely or predominantly exceeding 500 nm.

15. A method as claimed in claim 14, wherein the composition is such that the radiation to which it is sensitive is electromagnetic radiation entirely or predominantly in the range 600 to 1400 nm.

16. A method as claimed claim 12, wherein the composition is such that it may be patternwise exposed by radiation delivered by a laser.

17. A method as claimed in claim 12, wherein the coating is such that on patternwise exposure to radiation it converts said radiation to heat.

18. A method as claimed in claim 17, wherein said coating comprises an additional layer disposed beneath the said composition, wherein the additional layer comprises a radiation absorbing compound able to absorb said radiation and convert it to heat.

19. A method as claimed in claim 18, wherein the separate radiation absorbing layer is a thin layer of dye or pigment.

20. A method as claimed in claim 18, wherein the separate radiation absorbing layer is a thin layer of metal or metal oxide.

21. A method as claimed in claim 12, wherein the composition is such that on imagewise exposure to radiation said composition itself absorbs said radiation and converts said radiation to heat.

22. A method as claimed in claim 21, wherein said composition comprises a radiation absorbing compound able to absorb said radiation and convert it to heat.

23. A method as claimed in claim 22, wherein the radiation absorbing compound is a pigment.

24. A method as claimed in claim 23, wherein the pigment is an organic pigment.

25. A method as claimed in claim 24, wherein the pigment is a phthalocyanine pigment.

26. A method as claimed in claim 23, wherein the pigment is an inorganic pigment.

27. A method as claimed in claim 26, wherein the pigment is selected from Prussian Blue, Heliogen Green or Nigrosine.

28. A method as claimed in claim 22, wherein the radiation absorbing compound is carbon black.

29. A method as claimed in claim 22, wherein the radiation absorbing compound is a dye selected from one of the following classes, squarylium, merocyanine, cyanine, indolizine, pyrylium or metal dithioline.

30. A method as claimed in claim 1, wherein the aqueous alkaline developer solubility of the composition is increased on heating.

31. A method as claimed in claim 30, wherein said compound which reduces the aqueous developer solubility of the phenolic resin is a compound which comprises at least one nitrogen atom which is quarternised.

32. A method as claimed in claim 30, wherein the compound which reduces the aqueous developer solubility of the phenolic resin is a compound which comprises at least one nitrogen atom incorporated in a heterocyclic ring.

33. A method as claimed in claim 32, wherein the compound which reduces the aqueous developer solubility of the phenolic resin is selected from a quinoline and a triazole.

34. A method as claimed in claim 30, wherein the compound which reduces the aqueous developer solubility of the phenolic resin is a compound which comprises at least one quarternised nitrogen atom incorporated in a heterocyclic ring.

35. A method as claimed in claim 34, wherein the compound which reduces the aqueous developer solubility of the phenolic resin is selected from a imidazoline compound, a quinolinium compound, a benzothiazolium compound and a pyridinium compound.

36. A method as claimed in claim 35, wherein the quinolinium compound is a cyanine dye.

37. A method as claimed in claim 35, wherein the benzothiazolium compound is a cyanine dye.

38. A method as claimed in claim 30, wherein the compound which reduces the aqueous developer solubility of the phenolic resin is a triarylmethane compound.

39. A method as claimed in claim 30, wherein the compound which reduces the aqueous developer solubility of the phenolic resin is a compound which comprises a carbonyl functional group.

40. A method as claimed in claim 39, wherein the compound which reduces the aqueous developer solubility of the phenolic resin is selected from a flavone compound.

41. A method as claimed in claim 39, wherein the compound which reduces the aqueous developer solubility of the phenolic resin is selected from flavanone, xanthone, benzophenone, N-(4-bromobutyl)phthalimide, 2,3-diphenyl-1-indeneone and phenanthrenequinone.

42. A method as claimed in claim 30, wherein the compound which reduces the aqueous developer solubility of the phenolic resin is a compound of general formula:

Where $Q_1$ represents an optionally substituted phenyl or alkyl group, n represents 0,1 or 2, and $Q_2$ represents a halogen atom or an alkoxy group.

43. A method as claimed in claim 30, wherein the compound which reduces the aqueous developer solubility of the phenolic resin is selected from ethyl-p-toluene sulphonate and p-toluenesulphonyl chloride.

44. A method as claimed in claim 30, wherein the compound which reduces the aqueous developer solubility of the phenolic resin is 3,6-bis[dimethylamino]acridine.

45. A method as claimed in claim 30, wherein the compound which reduces the aqueous developer solubility of the phenolic resin is a ferrocenium compound.

46. A method as claimed in claim 1, wherein the compound which reduces the aqueous alkaline developer solubility of the phenolic resin is also a radiation absorbing compound able to absorb said radiation and convert it to heat.

47. A method as claimed in claim 46, wherein the compound which reduces the aqueous developer solubility of the phenolic resin and is also a radiation absorbing compound is a cyanine dye which comprises a quinolinium moiety.

48. A method as claimed in claim 1, wherein the phenolic resin has functional groups Q thereon, such that the functionalised phenolic resin has the property that it is developer insoluble prior to delivery of radiation and developer soluble thereafter, wherein the functional groups Q do not comprise a naphthoquinone diazide or a benzoquinone diazide group.

49. A method as claimed in claim 48, wherein the functional groups Q are selected from groups which comprise amino, monoalkylamino, dialkylamino, amido, monoalkylamido, dialkylamido, chloro, fluoro, carbonyl, sulphinyl or sulphonyl moieties.

50. A method as claimed in claim 48, wherein the functionalised phenolic resin is defined by the formula R—(Q)$_n$ wherein R represents the polymer chain of the phenolic resin and (Q)$_n$ represents functional groups bonded thereto, wherein Q represents a group of formula T-Z where T represents a moiety which hydrogen bonds to the polymer chain R of the same molecule or an adjacent molecule or molecules and Z represents a further moiety which optionally hydrogen bonds to the polymer chain R of the same molecule or an adjacent molecule or molecules, and n is a plural integer.

51. A method as claimed in claim 50, wherein T represents a carbonyl group, a sulphinyl group or a sulphonyl group.

52. A method as claimed in claim 50, wherein T represents a group of formula —O—X(Z)—O— wherein X represents a linking moiety and Z is a moiety which optionally hydrogen bonds to the polymer chain R of the same molecule or an adjacent molecule or molecules.

53. A method as claimed in claim 50, wherein Z represents an optionally substituted alkyl, alkenyl, alkynyl, cycloalkyl, aryl, heteroaryl, heterocyclic, aralkyl or heteroaralkyl group.

54. A method as claimed in claim 53, wherein Z represents an optionally substituted aryl group, an optionally substituted heteroaryl group or an optionally substituted alkyl group.

55. A method as claimed in claims 50, wherein the ratio of functional groups Q in the functionalised phenolic resin to hydroxy groups in the corresponding unfunctionalised phenolic resin is in the range 1:100 to 1:2.

56. A method as claimed in claim 55, wherein the said ratio is in the range 1:50 to 1:3.

57. A method as claimed in claim 56, wherein the said ratio is in the range 1:20 to 1:6.

58. A method as claimed in claim 48, wherein the phenolic resin is a resin ester of the general formula R(Q)$_n$ where R is the polymer chain of the phenolic resin, n is a plural integer, and Q represents a group of formula O—T$^1$—Z where T$^1$ represents a carbonyl group, a sulphinyl group or a sulphonyl group, or a group of formula —O—X(Z)—O— where X represents a group —P(O)—; wherein Z represents an alkyl, alkenyl, alkylnyl, cycloalkyl, aryl, heteroaryl, non-aromatic heterocyclic, aralkyl or heteroalkyl group, each such group being optionally substituted; wherein optional substituents of the aryl and heteroaryl groups, and of the aryl and heteroaryl parts of the aralkyl or heteroaralkyl groups, are selected from halo, nitro, cyano, hydroxy, thiol, amino, optionally substituted mono-C$_{1-4}$ alkylamino, optionally substituted di-C$_{1-4}$ alkylamino, amido, optionally substituted mono-(C$_{1-4}$ alkyl)amido, optionally substituted di-(C$_{1-4}$ alkyl)amido, optionally substituted C$_{2-4}$ alkenyl, optionally substituted C$_{1-4}$ alkyl, optionally substituted C$_{1-4}$ alkoxy, (C$_{1-4}$ alkyl)carbonylamino, —COOH, optionally substituted (C$_{1-4}$ alkyl)carbonyl and optionally substituted (C$_{1-4}$ alkoxy)carbonyl groups; and wherein optional substituents of the alkyl, alkenyl, alkynyl, cycloalkyl and non-aromatic heterocyclic groups, and of the alkyl parts of the aralkyl or heteroaralkyl groups, and of the alkyl, alkoxy, alkylamino, alkylamido, alkylcarbonyl, alkoxycarbonyl, alkylcarbonylamino and alkenyl moieties optionally substituting said aryl or heteroaryl moieties are selected from halo, nitro, cyano, carbonyl, hydroxy, thiol, amino, mono-C$_{1-4}$ alkylamino, di-C$_{1-4}$ alkylamino, amido, mono-(C$_{1-4}$ alkyl) amido, di-(C$_{1-4}$ alkyl)amido, C$_{1-4}$ alkoxy, —COOH, (C$_{1-4}$ alkyl)carbonylamino, (C$_{1-4}$ alkyl)carbonyl and (C$_{1-4}$ alkoxy) carbonyl groups.

59. A method as claimed in claim 58, wherein T$^1$ represents a sulphonyl or carbonyl group and Z represents a phenyl or naphthyl group optionally substituted by a dialkylamino or alkyl group; or wherein Z represents a thienyl group or a C$_{2-8}$ alkyl group.

60. A method as claimed in claim 1, wherein the phenolic resin has functional groups Q thereon, such that the functionalised phenolic resin has the property that it is developer insoluble prior to delivery of radiation and developer soluble thereafter, wherein the functional groups Q do not contain a diazide group.

61. A method as claimed in claim 1, wherein the phenolic resin has functional groups Q thereon, such that the functionalised phenolic resin has the property that it is developer insoluble prior to delivery of radiation and developer soluble thereafter, wherein the functional groups are not chemically decomposed on exposure to said radiation.

62. A method as claimed in claim 1, wherein the phenolic resin has functional groups Q thereon, such that the functionalised phenolic resin has the property that it is developer insoluble prior to delivery of radiation and developer soluble thereafter, wherein the functional groups Q do not comprise acid groups or acid generating groups, in each case protected by labile protective groups removed on exposure to said radiation.

63. A method as claimed in claim 1, wherein the phenolic resin has functional groups Q thereon, such that the functionalised phenolic resin has the property that it is developer insoluble prior to delivery of radiation and developer soluble thereafter, wherein the functional groups Q are not additionally primarily responsible for the absorbtion of said radiation.

64. A method as claimed in claim 1, wherein the phenolic resin has functional groups Q thereon, such that the functionalised phenolic resin has the property that it is developer insoluble prior to delivery of radiation and developer soluble thereafter, wherein there is hydrogen bonding between said functional groups Q and other groups of the same molecule or other molecule(s) of the polymeric substance.

65. A method as claimed in claim 1, wherein the composition comprises a novolak resin, a radiation sensitive latent acid generating compound, a condensing agent for the novolak resin and an infra-red absorbing compound.

66. A method as claimed in claim 65, wherein the condensing agent is an optionally substituted polyvinyl phenol compound or a bis-hydroxyalkyl compound.

67. A method as claimed in claim 1, wherein the composition includes a means for increasing the resistance of non-heated areas of the heat sensitive composition to dissolution in an aqueous developer (hereinafter the "developer resistance means"), wherein said developer resistance means comprises one or more compounds selected from the group consisting of:

(A) compounds which include a poly(alkylene oxide) unit;

(B) siloxanes; and (C) esters, ethers and amides of polyhydric alcohols.

68. A positive working lithographic printing form precursor per se produced by a method as claimed in claim 1.

69. A method of producing a printing form, comprising an exposure step of effecting heating of selected areas of the composition of a precursor as claimed in claim 68, such as to render such areas developer soluble, followed by development in an aqueous developer to remove said selected areas.

70. A lithographic printing form produced by a method as claimed in claim 69.

71. A method of manufacturing a printing form precursor which comprises a coating on a substrate, the coating comprising an aqueous alkaline developer-soluble positive working composition which comprises a resole resin, a novolak resin, a latent Bronsted acid and an infra-red absorbing compound, wherein the method of manufacturing comprises the application of the composition in a solvent to the substrate, the drying of the composition, and the subsequent heat treatment of the coated substrate, wherein the heat treatment is carried out for at least 4 hours, and the aqueous alkaline developer solubility of the composition is not increased by incident UV radiation.

* * * * *